US012165710B2

(12) United States Patent
Kawai et al.

(10) Patent No.: US 12,165,710 B2
(45) Date of Patent: Dec. 10, 2024

(54) MEMORY DEVICES USING A DYNAMIC LATCH TO PROVIDE MULTIPLE BIAS VOLTAGES

(71) Applicant: Micron Technology, Inc., Boise, ID (US)

(72) Inventors: Koichi Kawai, Yokohama (JP); Yoshihiko Kamata, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 484 days.

(21) Appl. No.: 17/591,516

(22) Filed: Feb. 2, 2022

(65) Prior Publication Data

US 2023/0069616 A1 Mar. 2, 2023

Related U.S. Application Data

(60) Provisional application No. 63/237,711, filed on Aug. 27, 2021.

(51) Int. Cl.
| | | |
|---|---|---|
| *G11C 16/04* | (2006.01) | |
| *G11C 16/10* | (2006.01) | |
| *G11C 16/24* | (2006.01) | |
| *G11C 16/26* | (2006.01) | |
| *G11C 16/34* | (2006.01) | |

(52) U.S. Cl.
CPC .......... *G11C 16/26* (2013.01); *G11C 16/0483* (2013.01); *G11C 16/10* (2013.01); *G11C 16/24* (2013.01); *G11C 16/3459* (2013.01)

(58) Field of Classification Search
CPC ..... G11C 16/26; G11C 16/0483; G11C 16/10; G11C 16/24; G11C 16/3459; G11C 7/065; G11C 2211/5621; G11C 11/5628; G11C 16/32
See application file for complete search history.

(56) References Cited

U.S. PATENT DOCUMENTS

| | | | | |
|---|---|---|---|---|
| 2009/0141558 A1* | 6/2009 | Sarin | ...................... | G11C 16/12 365/185.21 |
| 2013/0176778 A1* | 7/2013 | Chen | ...................... | G11C 16/06 365/185.03 |
| 2013/0322170 A1* | 12/2013 | Goldman | ............... | G11C 16/04 365/185.21 |
| 2015/0146488 A1* | 5/2015 | Lim | ........................ | G11C 16/26 365/185.11 |
| 2016/0203878 A1* | 7/2016 | Chen | .................. | G11C 16/3459 711/109 |
| 2017/0345511 A1* | 11/2017 | Vali | ..................... | G11C 16/3427 |

* cited by examiner

*Primary Examiner* — Hien N Nguyen
(74) *Attorney, Agent, or Firm* — Lowenstein Sandler LLP

(57) ABSTRACT

A memory device includes a sense amplifier (SA) latch coupled to a sense node. A dynamic latch (DL) is connected to the SA latch and coupled to sense node. A sense line includes the sense node and is selectively connected to the SA latch, the DL, and a bit line that is coupled to a memory cell string. Control logic is coupled to the SA latch and the DL, and to: cause a pre-program verify voltage to boost the sense node; and, in response to detecting a high bit value stored in SA latch, cause a voltage to turn on set transistor(s) of DL so that a first bias voltage or a second bias voltage is stored at a latch transistor. The first bias voltage is useable for slow programming of a selected memory cell and the second bias voltage is useable for fast programming of the selected memory cell.

20 Claims, 20 Drawing Sheets

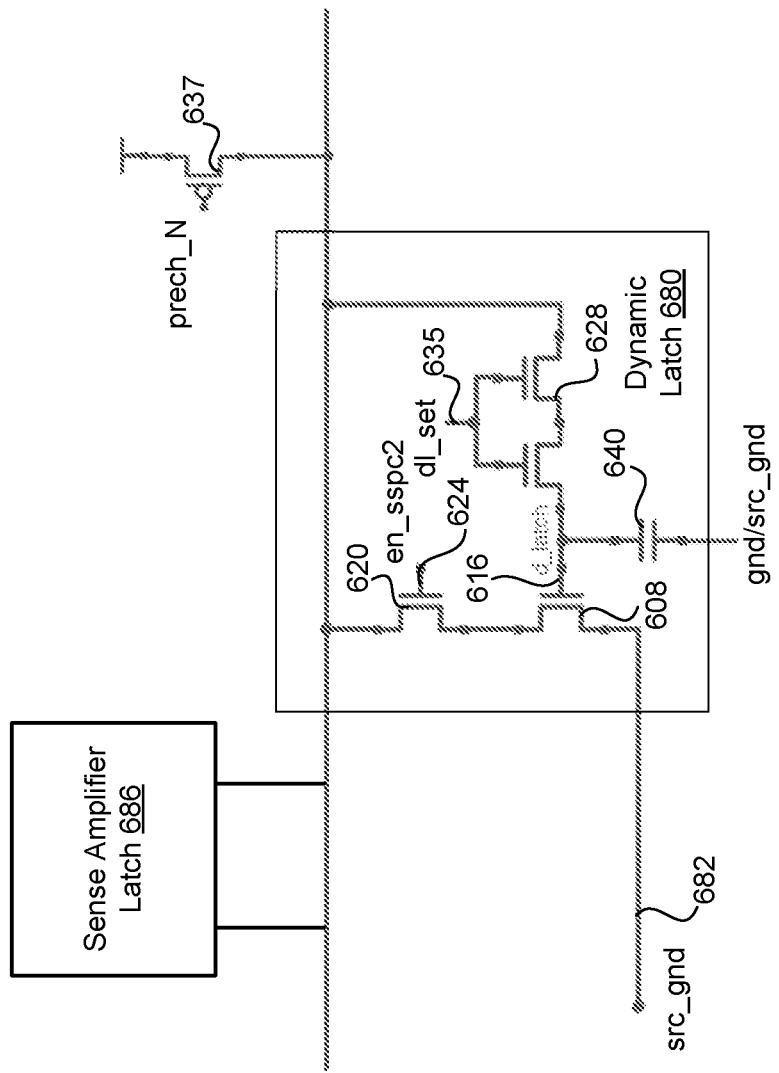

| TP | TC | SA_Latch | D_latch (DL) | Data Transfer (DL) |
|---|---|---|---|---|
| 1002 Initial State - after Lv2 PVY, TC has analog level (~ lstring of cell). | LV2 sspc LV2 sspc2 | | LV1 sspc LV1 sspc2 | |
| 1006 SA_Latch Reset | LV2 sspc LV2 sspc2 | L | LV1 sspc LV1 sspc2 | |
| 1010 Copy LV1 sspc to SA_Latch (src_gnd=0.5V to turn off LV1 sspc2) | LV2 sspc LV2 sspc2 | LV1 sspc | LV1 sspc LV1 sspc2 | |
| 1014 Strobe TC to SA_latch (boost_ppv1 for boost modulation) | LV2 sspc LV2 sspc2 | LV1 sspc +LV2 sspc | LV1 sspc LV1 sspc2 | |
| 1018 Back up LV1 sspc2 data to data_transfer (src_gnd=gnd) | LV2 sspc LV2 sspc2 | LV1+LV2 sspc | LV1 sspc LV1 sspc2 | LV1 sspc2 |
| 1022 Copy SA_Latch to d_latch (dl_set = Vsg) | LV2 sspc LV2 sspc2 | LV1 + LV2 sspc | LV1 + LV2 sspc | LV1 sspc2 |
| 1028 SA_Latch Reset | LV2 sspc LV2 sspc2 | L | LV1 + LV2 sspc | LV1 sspc2 |
| 1032 Copy LV1 sspc2 to SA_Latch (data transfer --> SA_Latch) | LV2 sspc LV2 sspc2 | LV1 sspc2 | LV1 + LV2 sspc | LV1 sspc2 |
| 1036 Strobe TC to SA_Latch (boost_ppv2 for boost modulation) | LV2 sspc LV2 sspc2 | LV1 sspc2 +LV2 sspc2 | LV1 + LV2 sspc | LV1 sspc2 |
| 1040 DL Update sspc2 (dl_set = Vcc) | LV2 sspc LV2 sspc2 | LV1 + LV2 sspc2 | LV1 + LV2 sspc LV1 + LV2 sspc2 | LV1 sspc2 |

FIG. 10C

MEMORY DEVICES USING A DYNAMIC LATCH TO PROVIDE MULTIPLE BIAS VOLTAGES

REFERENCE TO RELATED APPLICATION

This application claims the benefit of U.S. Provisional Patent Application No. 63/237,711, filed Aug. 27, 2021, the entirety of which is incorporated herein by this reference.

TECHNICAL FIELD

Embodiments of the disclosure are generally related to memory sub-systems, and more specifically, relate to memory devices using a dynamic latch to provide multiple bias voltages.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 6B is a detailed schematic of the dynamic latch of the schematic of FIG. 6A according to at least one embodiment.

FIG. 10C is an annotated table illustrating and describing data flow through the page buffer according to the graphs of FIGS. 10A-10B according some embodiments.

DETAILED DESCRIPTION

Figure 1A:
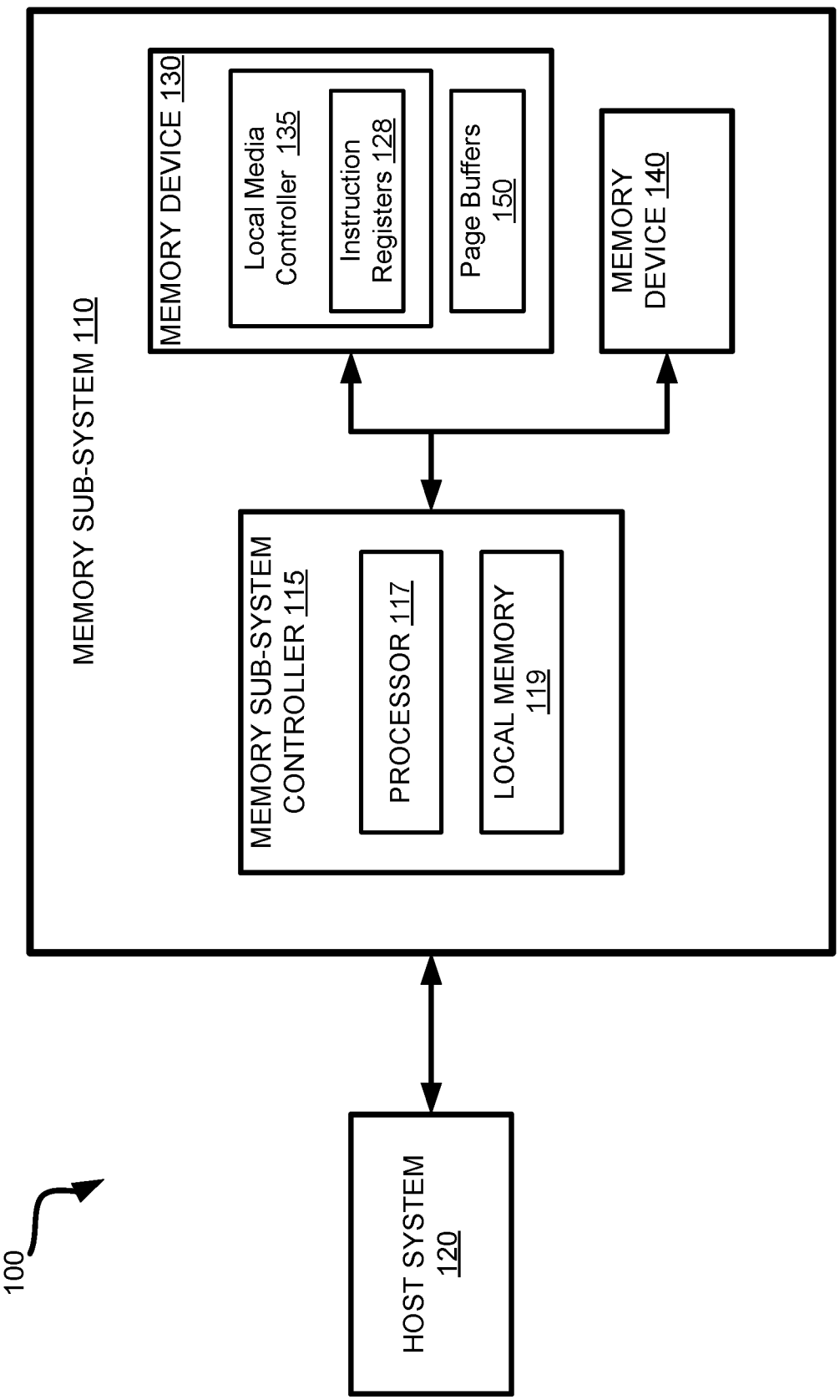
FIG. 1A illustrates an example computing system that includes a memory sub-system in accordance with some embodiments.

Embodiments of the present disclosure are directed to memory devices using a dynamic latch to provide multiple bias voltages. A memory device can be a non-volatile memory device. One example of non-volatile memory devices is a negative-and (NAND) memory device, which is an example of a flash memory device. Other examples of non-volatile memory devices are described below in conjunction with FIG. 1A. These memory devices include memory cells in which to store data. For example, changes in threshold voltage (Vt) of the memory cells, through programming (which is often referred to as writing) of charge storage structures (e.g., floating gates or charge traps) or other physical phenomena (e.g., phase change or polarization), determine the data state (or data value) of each memory cell.

In programming memory, memory cells can generally be programmed as single-level cells (SLC) or multiple-level cells (MLC). Single-level cells can use a single memory cell to represent one digit (e.g., bit) of data. For example, in SLC, a Vt of 2.5V can indicate a programmed memory cell (e.g., representing a logical 0) while a Vt of −0.5V can indicate an erased cell (e.g., representing a logical 1). As an example, the erased state in SLC can be represented by any threshold voltage less than or equal to 0V, while the programmed data state can be represented by any threshold voltage greater than 0V. Multiple-level cells use more than two Vt ranges, where each Vt range indicates a different data state. A margin (e.g., a certain number of volts) such as a dead space can separate adjacent Vt ranges to facilitate differentiating between data states. Multiple-level cells can take advantage of the analog nature of traditional non-volatile memory cells by assigning a bit pattern to a specific Vt range.

In programming MLC memory, data values are often programmed using more than one pass, e.g., programming one or more digits in each pass. For example, in four-level MLC (typically referred to simply as MLC), a first digit, e.g., a least significant bit (LSB), which is often referred to as lower page (LP) data, can be programmed to the memory cells in a first pass, thus resulting in two (e.g., first and second) threshold voltage ranges. Subsequently, a second digit, e.g., a most significant bit (MSB), which is often referred to as upper page (UP) data can be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) can represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data can be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) can represent a bit pattern of four bits, and 32-level MLC (typically referred to as PLC) can represent a bit pattern of five bits.

To program a group of memory cells to each Vt state of SLC or MLC memory, according to some embodiments, a local media control (e.g., control logic) of some memory devices causes different voltage levels to be applied to data lines (or bit lines) that causes selected memory cell(s), such as a population of memory cells, to be programmed. In these embodiments, the control logic can send a control signal to a signal driver that is selectively connected between a page buffer and a bit line. The page buffer can provide voltage levels to the signal driver that the signal driver can use, when turned on by the control signal, to generate a voltage on the bit line that programs a selected memory cell of the group of memory cell(s). These voltage levels can vary in voltage depending on a level (or speed) of programming to occur, as will be explained.

In some embodiments, programming the memory cells can occur in programming schemes referred to as selective slow programming convergence (SSPC). In SSPC programming, for example, memory cells nearer to their respective intended data states are programmed more slowly (e.g., partially enabled for programming) compared to memory cells farther from their respective intended data states (e.g., fully enabled for programming) while receiving a same voltage level at their respective control gates. A target voltage can correspond to a minimum threshold voltage ($PV_{TARGET}$) for a target Vt level, which can be referred to as the final program verify voltage for the target voltage. A first pre-program verify voltage ($PPV_1$) can be selected to be less than the final program verify voltage to enable slow SSPC programming. A second pre-program verify voltage ($PPV_2$) can be selected to be less than the slow SSPC program verify voltage ($PPV_1$) to enable fast SSPC programming, where the fast SSPC programming is faster than the slow SSPC programming.

Depending on how close memory cells are from the target voltage, the page buffers can be directed to provide a bias voltage to the memory cells (via signal drivers) to selectively control the voltage levels actually being applied to the group or population of memory cells. As the memory cells get closer to their respective target voltages, the applied bias voltages generally increase so that the actual program pulse voltages decrease, slowing down the programming rate. For example, four bias voltages can correspond to at least four voltage levels, including non-SSPC programming, fast SSPC programming, slow SSPC programming, and inhibited from programming. Of these four bias voltages, any given page buffer may provide one of the bias voltages at any given time depending on a phase of SSPC-related programming in which the memory cells are being programmed by that particular page buffer. These voltages can also be applied during program verify operations associated with determining how close the memory cells have been programmed to the target voltage, which can then lead to switching to apply a different, perhaps slower programming, voltage bias level for a subsequent phase of SSPC programming.

In some memory devices, pages buffers store these four bias voltages in a combination of primary data caches (PDC) and a dynamic latch. While each PDC can be understood to be a separate memory latch, the dynamic latch can store a bias voltage within one or more transistors (and/or other parasitic capacitance) of the page buffer circuitry. As the sophistication of SSPC programming has progressed, additional latches, including PDC, have been added to store multiple SSPC-related bias voltage levels, which has caused the page buffers to grow in size, and thus increased cost, as well as to slow down due to additional data access of external latches.

Aspects of the present disclosure address the above and other deficiencies by adding an additional dynamic latch to a page buffer to provide at least two bias voltages that are associated with the at least both the slow SSPC voltage (e.g., $PPV_1$) and the fast SSPC voltage (e.g., $PPV_2$). Adding this dynamic latch, for example, can enable elimination of a static PDC, where static latch is significantly larger than a dynamic latch. In various embodiments, this additional dynamic latch is connected to a sense amplifier (SA) latch that stores one of two bit values, e.g., a high bit value (or "1") or a low bit value (or "0"). The SA latch is selectively connected to a sense node of the page buffer.

In at least some embodiments, the dynamic latch includes a latch transistor having a source coupled to a source bias node and a drain selectively connected to the sense node. The latch transistor can further include one or more set transistors coupled between the SA latch and a gate of the latch transistor, the one or more set transistors are also selectively connected to the sense node. A sense line can include the sense node and be selectively connected to the SA latch, the dynamic latch, and a bit line that is coupled to a string of series-connected memory cells.

In these embodiments, a local media controller (or simply controller) of a memory device can be coupled to the SA latch, the dynamic latch, in addition to other page buffer circuitry. The controller can be configured to perform operations such as causing a pre-program verify voltage to provide a boost to the sense node and, in response to detecting a high bit value stored in the SA latch, causing a set voltage to turn on the one or more set transistors so that one of a first bias voltage or a second bias voltage is stored at the latch transistor. For example, the first bias voltage or the second bias voltage can be stored in a gate capacitance of the latch transistor. In at least some embodiments, both the pre-program verify voltage and the set voltage can be at different voltages depending on whether the first bias voltage or the second bias voltage is to be stored in the latch transistor, as will be discussed. In various embodiments, the first bias voltage is useable for slow programming of a selected memory cell of the string of series-connected memory cells, e.g., be associated with the slow SSPC voltage (e.g., $PPV_1$). In these embodiments, the second bias voltage is useable for fast programming of the selected memory cell of the string of series-connected memory cells, e.g., be associated with the fast SSPC voltage (e.g., $PPV_2$).

Further, the additional dynamic latch can likewise be employed in providing the first bias voltage or the second bias voltage to the sense node in order to be used in SSPC programming, to include SSPC program verify operations, at the $PPV_1$ or $PPV_2$ voltage levels, respectively. Additionally, the additional dynamic latch can also be employed in accumulating bias voltage levels for slow SSPC voltage and fast SSPC voltage levels as MLC programming moves from programming a lower Vt range of a first bit level to programming a higher Vt range of a second bit level, for example.

Therefore, advantages of the systems and methods implemented in accordance with some embodiments of the present disclosure include, but are not limited to, elimination of external PDC latches that cause the page buffer areas to grow. Further, elimination of these latches enable increased speed and performance of programming memory cells in MLC memory devices. Other advantages will be apparent to those skilled in the art of memory programming, to include selective slow program convergence, associated with a memory device discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DEVIM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes page buffers 150, which can be used to program data to the memory cells of the memory device 130 and to read the data out of the memory cells. Control logic of the local media controller 135 can be configured to coordinate the timing and manner of applying one of four different voltage biases for selective slow program convergence voltage programming, as will be explained in detail. These four different bias voltages can be associated with, for example, program verify pass voltage (e.g., inhibit bias voltage), a slow selective slow program convergence voltage (e.g., $PPV_1$), a fast selective slow program convergence voltage (e.g., $PPV_2$), and a program verify fail voltage (e.g., ground or Vss).

In at least some embodiments, the local media controller 135 includes instruction registers 128, which represent computer-usable memory for storing computer-readable instructions. For some embodiments, the instruction registers 128 represent firmware. Alternatively, the instruction registers 128 represent a grouping of memory cells, e.g., reserved block(s) of memory cells, of the array of memory cells 104.

Figure 1B:
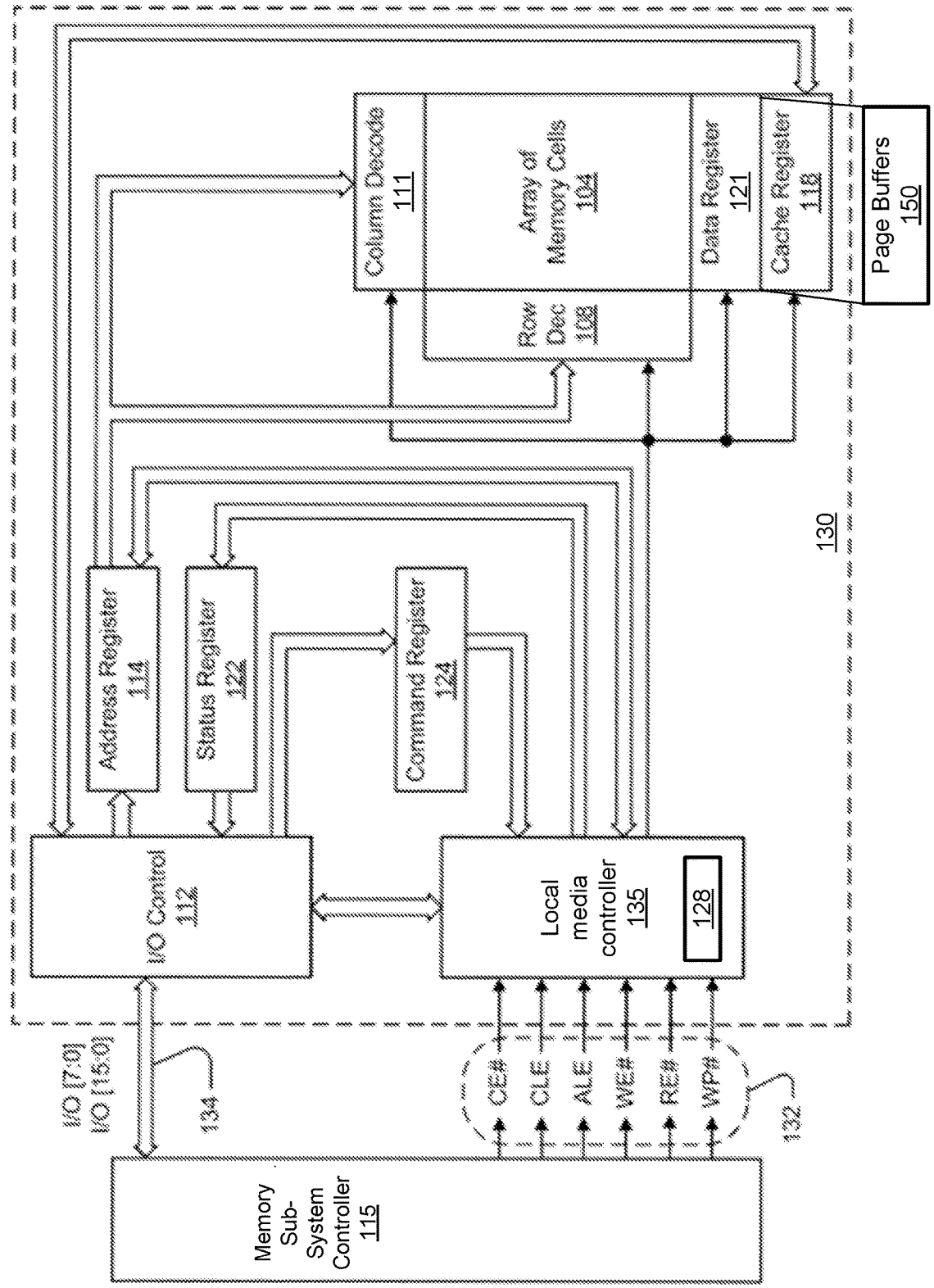
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and the local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffers 150 of the memory device 130. The page buffers 150 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 6-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
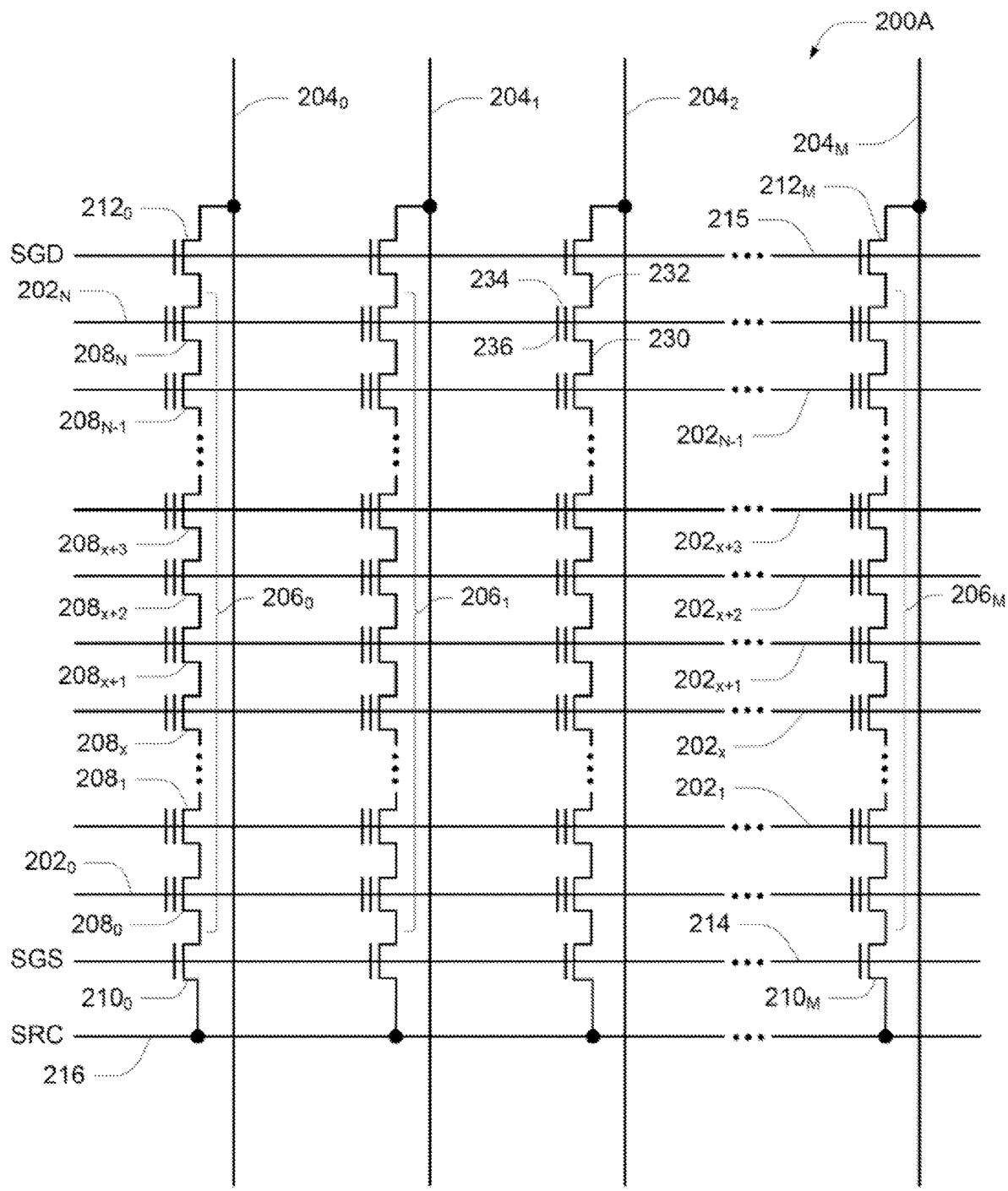
FIG. 2A-2C are schematics of portions of an array of memory cells as could be used in a memory of the type described with reference to FIG. 1B according to an embodiment.
Figure 2B:
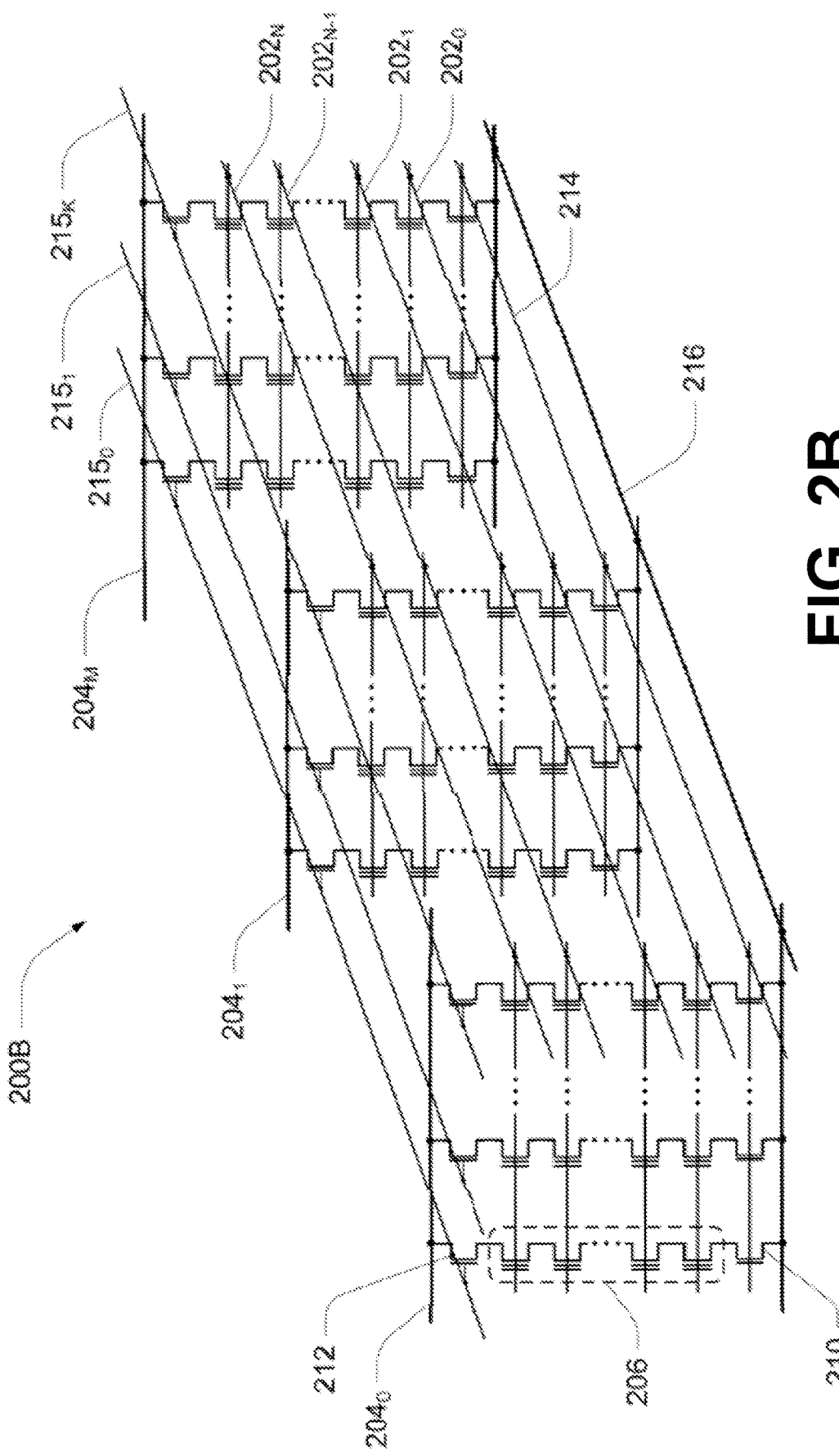
Figure 2C:
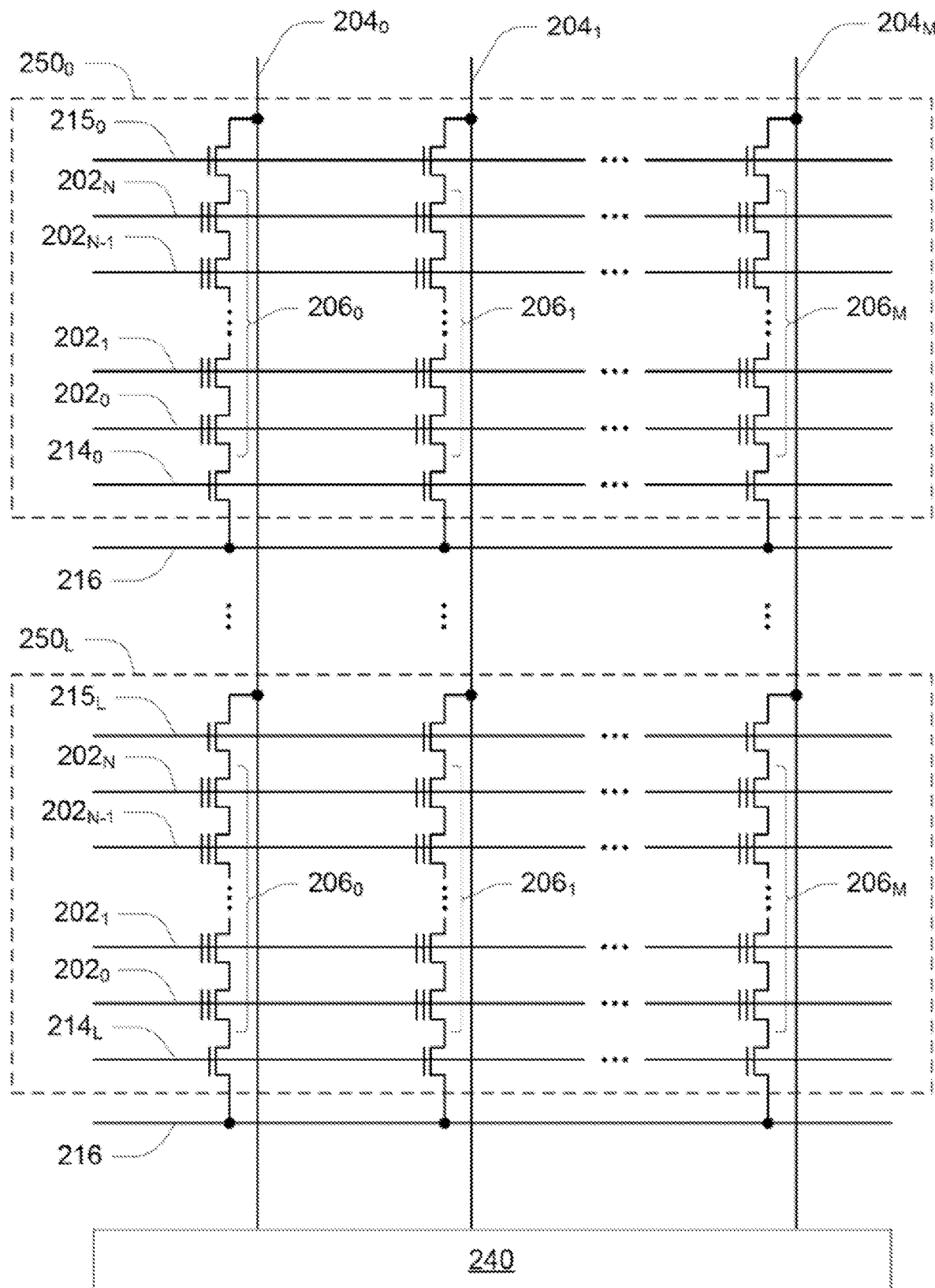

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate 2100 can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells 250L. For example, each block of memory cells 2500-250L can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

Figure 3:
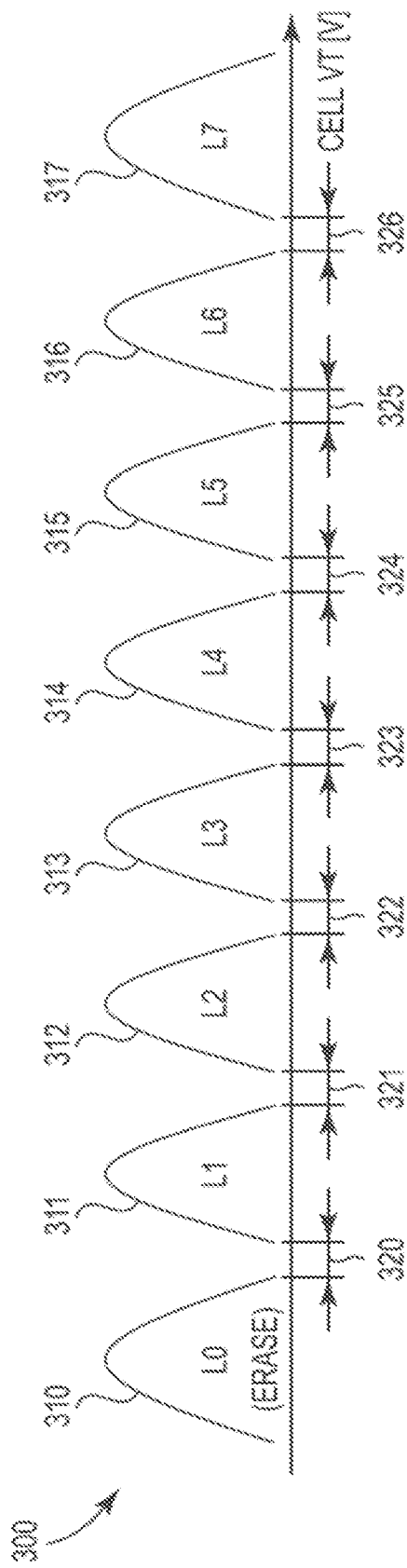
FIG. 3 is a diagrammatic illustration that depicts memory cell populations for a triple-level cell (TLC) memory according to at least one embodiment.

FIG. 3 is a diagrammatic illustration that depicts memory cell populations for a triple-level cell (TLC) memory according to at least one embodiment. For simplicity, FIG. 3 and the following FIG. 4 will presume programming operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, programming operations performed on lower storage density memory cells, e.g., SLC (two data states) or higher storage density memory cells, e.g., QLC (16 data states) or PLC (32 data states) memory cells, are equally applicable.

In this example, the population of memory cells 310 can be erased memory cells and represent a logical data value of '111', the population of memory cells 311 can represent a logical data value of '011', the population of memory cells 312 can represent a logical data value of '001', the population of memory cells 313 can represent a logical data value of '101', the population of memory cells 314 can represent a logical data value of '100', the population of memory cells 315 can represent a logical data value of '000', the population of memory cells 316 can represent a logical data value of '010', and the population of memory cells 317 can represent a logical data value of '110', where the right-most digit can represent the lower page data for a memory cell having a threshold voltage within the threshold voltage range of its respective population of memory cells, the center digit can represent the upper page data for that memory cell, and the left-most digit can represent the extra page data for that memory cell. Although a specific example of binary representation is provided, embodiments can use other arrangements of bit patterns to represent the various data states.

A read window between the population of memory cells 310 and the population of memory cells 311 is indicated at 320, which is the distance (e.g., in voltage) between adjacent Vt distributions for the memory cells representing data states L0 and L1. A read window between the population of memory cells 311 and the population of memory cells 312 is indicated at 321, which is the distance (e.g., in voltage) between adjacent Vt distributions for the memory cells representing data states L1 and L2. Likewise, a read window between the population of memory cells 312, 313, 314, 315, and 316, and the population of memory cells 313, 314, 315, 316, and 317 is indicated at 322, 323, 324, 325, and 326, respectively, which is the distance between adjacent Vt distributions for the memory cells representing data states L2, L3, L4, L5, L6, and L7. A read window budget (RWB) can refer to a cumulative value of read windows for a group of programmed cells (e.g., one or more pages of cells). In this example, the RWB can be the cumulative value (e.g., in voltage) of the seven read windows 320-326 between the eight Vt distributions.

Figure 4:
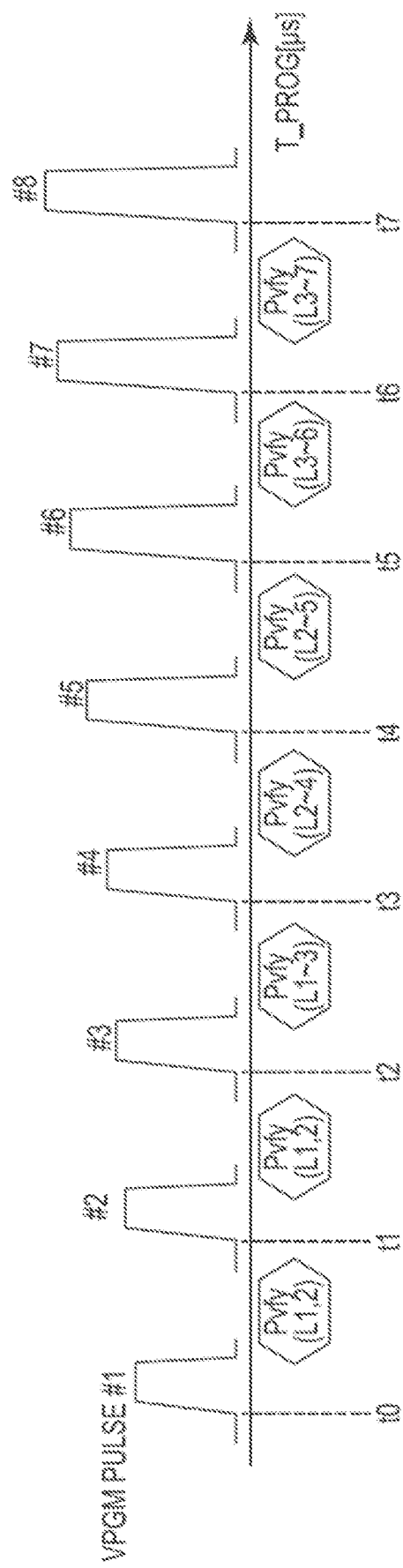
FIG. 4 is a timing diagram depicting a portion of a programming operation to program selected TLC memory cells to target threshold voltages according to an embodiment.

FIG. 4 is a timing diagram depicting a portion of a programming operation to program selected TLC memory cells to target Vt levels L0 to L7 (e.g., as illustrated in FIG. 3) according to an embodiment. Once a selected memory cell has been programmed to its target Vt level, the memory cell is inhibited from further programming. Prior to time to, memory cells selected for programming can be erased such that the selected memory cells each have a threshold voltage corresponding to level L0. At time t0, a first program pulse is applied to a selected access line (e.g., 202 of FIG. 2A) connected to the control gates (e.g., 236) of the selected memory cells (e.g., 208). After the first program pulse, a program verify operation can be performed to verify whether a target population of the selected memory cells has been programmed to level L1 or L2. At time t1, a second program pulse, e.g., higher than the first program pulse, is applied to the selected access line connected to the control gates of the selected memory cells. After the second program pulse, a program verify operation can be performed to verify whether target populations of the selected memory cells have been programmed to Vt level L1 or L2.

At time t2, a third program pulse, e.g., higher than the second program pulse, is applied to the selected access line connected to the control gates of the selected memory cells. After the third program pulse, a program verify operation can be performed to verify whether target populations of the selected memory cells have been programmed to level Vt L1, L2, or L3. At time t3, a fourth program pulse, e.g., higher than the third program pulse, is applied to the selected access line connected to the control gates of the selected memory cells. After the fourth program pulse, a program verify operation can be performed to verify whether target populations of the selected memory cells have been programmed to Vt level L2, L3, or L4. At time t4, a fifth program pulse, e.g., higher than the fourth program pulse, is applied to the selected access line connected to the control gates of the selected memory cells. After the fifth program pulse, a program verify operation can be performed to verify whether target populations of the selected memory cells have been programmed to Vt level L2, L3, L4, or L5.

At time t5, a sixth program pulse, e.g., higher than the fifth program pulse, is applied to the selected access line connected to the control gates of the selected memory cells. After the sixth program pulse, a program verify operation can be performed to verify whether target populations of the selected memory cells have been programmed to Vt level L3, L4, L5, or L6. At time t6, a seventh program pulse, e.g., higher than the sixth program pulse, is applied to the selected access line connected to the control gates of the selected memory cells. After the seventh program pulse, a program verify operation can be performed to verify whether target populations of the selected memory cells have been programmed to Vt level L3, L4, L5, L6, or L7. At time t7, an eighth program pulse, e.g., higher than the seventh program pulse, can be applied to the selected access line connected to the control gates of the selected memory cells and the process can repeat until the selected memory cells have been programmed to their target levels.

Figure 5A:
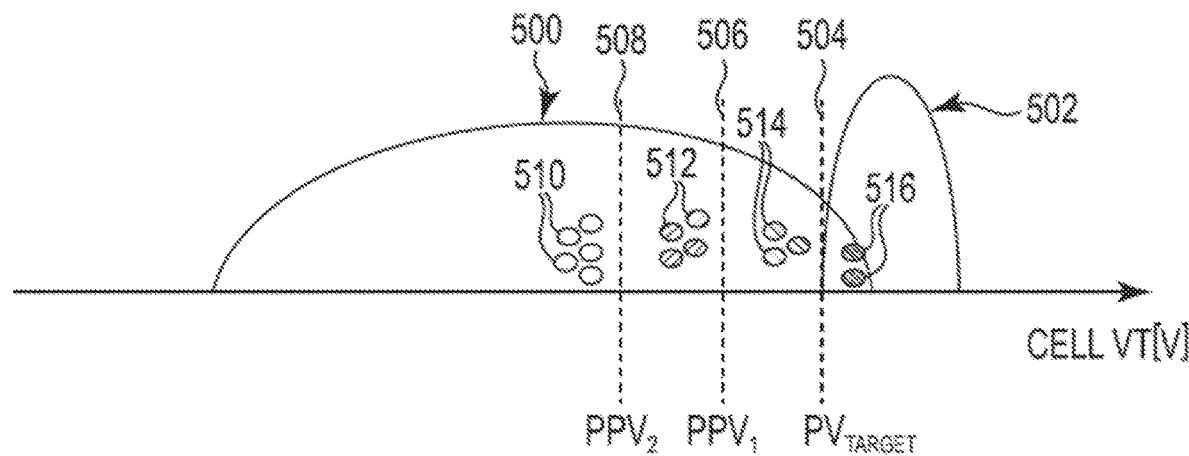
FIG. 5A and FIG. 5B are diagrammatic illustrations that depict a population of memory cells during a programming operation to program selected memory cells to a target voltage using selective slow program convergence according to at least one embodiment.
Figure 5B:
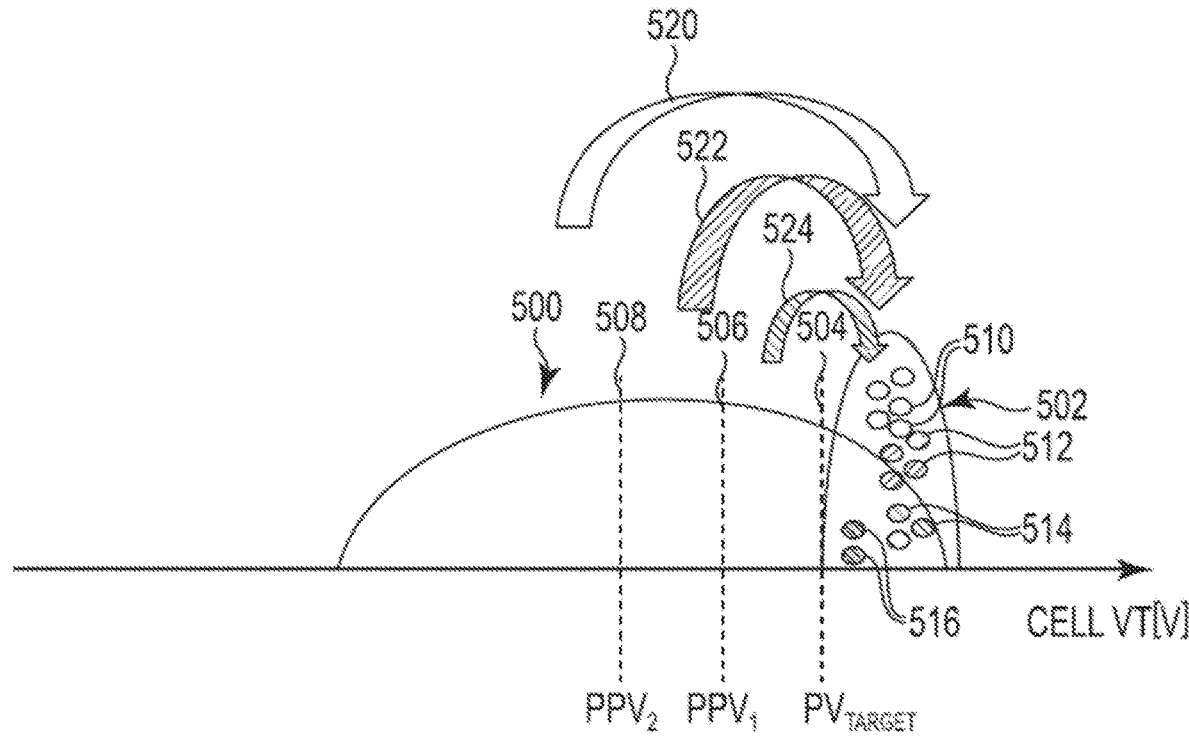

FIG. 5A and FIG. 5B are diagrammatic illustrations that depict a population of memory cells 500 during a programming operation to program selected memory cells to a target voltage (e.g., a target Vt level) using selective slow program convergence according to at least one embodiment. FIG. 5A depicts a population of memory cells 500 after a particular program pulse of a programming operation to program selected memory cells to a target voltage (or Vt level) as indicated by a population of memory cells 502. The use of different voltage levels on data lines to be enabled for programming can occur in programming schemes known as selective slow programming convergence (SSPC), where memory cells nearer to their respective intended data states are programmed more slowly (e.g., partially enabled for programming) compared to memory cells farther from their respective intended data states (e.g., fully enabled for programming) while receiving a same voltage level at their respective control gates. The target voltage may correspond to a minimum threshold voltage ($PV_{TARGET}$) for the target level, which can be referred to as a final program verify voltage 504 for the target voltage. A first pre-program verify voltage ($PPV_1$) 506 can be selected to be less than the final program verify voltage 504 to enable slow SSPC programming. A second pre-program verify voltage ($PPV_2$) 508 can be selected to be less than the slow SSPC program verify voltage ($PPV_1$) 506 to enable fast SSPC programming.

After the particular program pulse, a program verify operation is performed to sense the threshold voltage (Vt) of each memory cell within the population of memory cells 500. Memory cells having a threshold voltage less than the second pre-program verify voltage 508 as indicated for example at 510 are biased for non-SSPC programming (e.g., fully enabled for programming). Memory cells having a threshold voltage between the second pre-program verify voltage 508 and the first pre-program verify voltage 506 as indicated for example at 512 are biased for fast SSPC programming (e.g., partially enabled for programming at a first rate) since the memory cells fall within the fast SSPC range. Memory cells having a threshold voltage between the first pre-program verify voltage 506 and the final program verify voltage 504 as indicated for example at 514 are biased for slow SSPC programming (e.g., partially enabled for programming at a second rate less than the first rate) since the memory cells fall within a slow SSPC range. Memory cells having a threshold voltage greater than the final program verify voltage 504 as indicated for example at 516 are inhibited from further programming.

As illustrated in FIG. 5B, with each memory cell within the population of memory cells 500 biased for non-SSPC programming, fast SSPC programming, slow SSPC programming, or inhibited from programming, a subsequent program pulse is applied to the population of memory cells 500 to increase the threshold voltages of the memory cells to the target level as indicated by the population of memory cells 502. The subsequent program pulse can be immediately subsequent to the particular program pulse. With the memory cells 510 biased for non-SSPC programming, the threshold voltages of the memory cells 510 can be increased above the final program verify voltage 504 as indicated by 520 in response to the subsequent program pulse. With the memory cells 512 biased for fast SSPC programming, the threshold voltages of the memory cells 512 can be increased above the final program verify voltage 504 as indicated by 522 in response to the subsequent program pulse. With the memory cells 514 biased for slow SSPC programming, the threshold voltages of the memory cells 514 can be increased above the final program verify voltage 504 as indicated by 524 in response to the subsequent program pulse. After the subsequent program pulse, a program verify operation is performed to sense the threshold voltage of each memory cell within the population of memory cells 502. In this example, all the memory cells have a threshold voltage greater than the final program verify voltage 504 and are inhibited from further programming.

A memory cell can be biased for fast SSPC programming by biasing the data line connected to the memory cell to a fast SSPC voltage (e.g., Vt level) during the program pulse. A memory cell can be biased for slow SSPC programming by biasing the data line connected to the memory cell to a slow SSPC voltage during the program pulse. A memory cell can be biased for non-SSPC programming by causing the data line connected to the memory cell to be biased to a non-SSPC voltage level during the program pulse. A memory cell can be inhibited from programming by causing the data line connected to the memory cell to be biased to an inhibit voltage level during the program pulse. The fast SSPC voltage level (e.g., 0.5V, 0.75V, 1.0V, or the like) can be greater than the non-SSPC voltage level (e.g., 0V). The slow SSPC voltage level (e.g., 1.0V, 1.5V, 2.0V, or the like) can be greater than the fast SSPC voltage level and less than the inhibit voltage level (e.g., 3V, 3.5V, or a common collector voltage (Vcc) or the like). By using four data line bias voltages during programming, the number of program pulses used to program selected memory cells to their target Vt levels can be reduced compared to the number of program pulses used to program the selected memory cells to their target Vt levels using less than four data line bias voltages, thereby reducing the programming time. In addition, by using four data line bias voltages, the programming time can be reduced without reducing the read window budget.

Figure 6A:
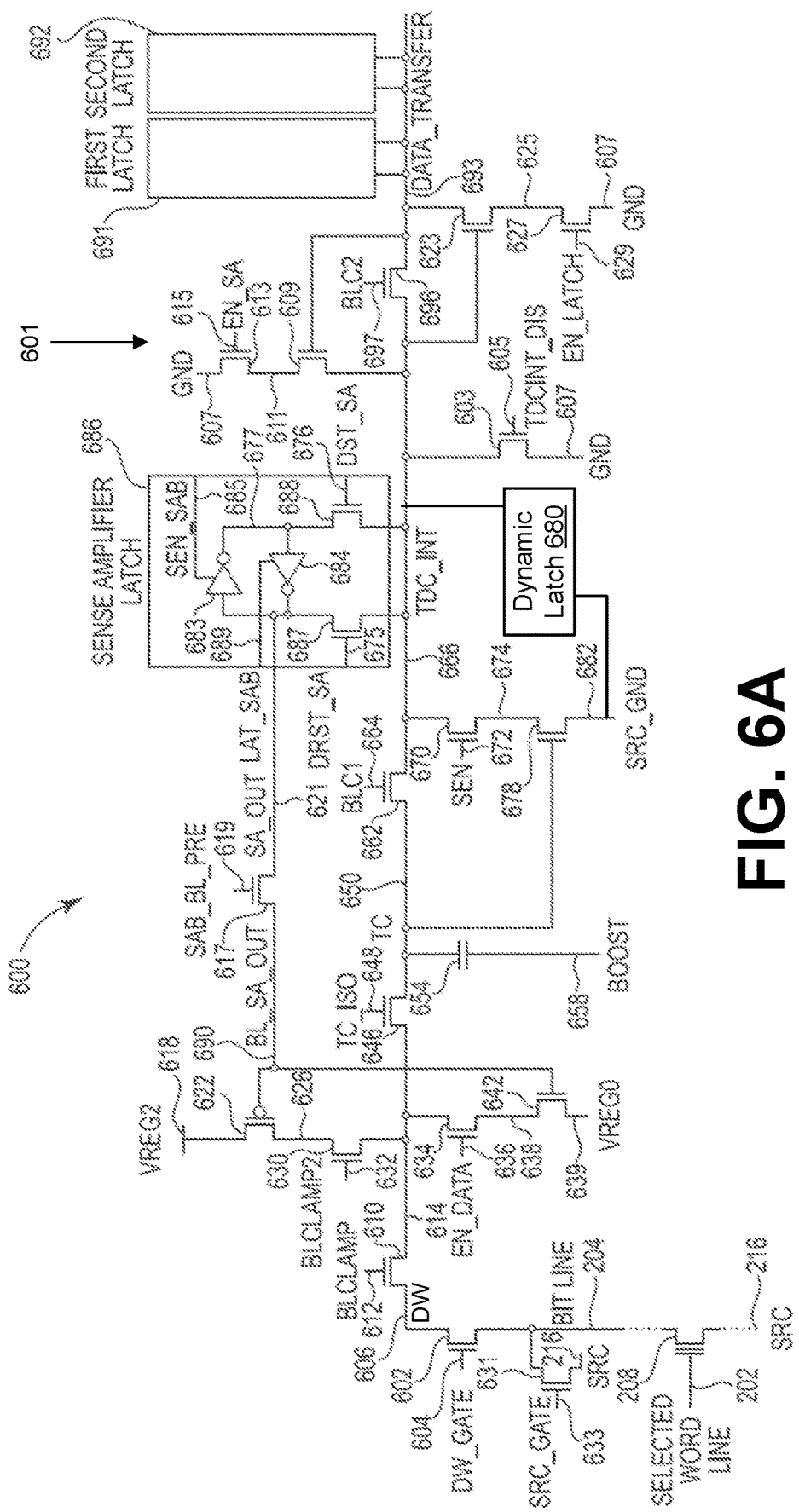
FIG. 6A is a schematic of portions of a page buffer that can be used in a memory of the type described with reference to FIGS. 1A-1B according to some embodiments.

FIG. 6A is a schematic of portions of a page buffer 600 that can be used in a memory of the type described with reference to FIGS. 1A-1B according to some embodiments. In some embodiments, the page buffer 600 is one of the page buffers 150 of FIGS. 1A-1B. The page buffer 600 can be a buffer portion 240 of FIG. 2C. The page buffer 600 includes a selected access line (e.g., word line) 202, a selected memory cell 208 of a string of series-connected memory cells (not shown), and a selected data line (e.g., bit line) 204, which is attached to the string of series-connected memory cells. The selected access line 202 is connected to the control gate of the selected memory cell 208. The source of the selected memory cell 208 is connected to the common source 216 (e.g., via other memory cells of the string of series-connected memory cells and a respective select gate 210). The drain of the selected memory cell 208 is connected to the selected bit line 204 (e.g., via other memory cells of the string of series-connected memory cells and a respective select gate 212).

In various embodiments, the page buffer 600 also includes transistors 602, 603, 609, 610, 613, 617, 622, 623, 627, 630, 631, 634, 642, 646, 662, 670, 678, and 696, a sense capacitor 654, a sense amplifier latch 686 (e.g., SA latch 686), a first latch 691, and a second latch 692. In some embodiments, the first latch 691 and the second latch 692 are each PDC latches that are coupled with the page buffer circuitry, as will be explained. Transistor 622 can be a p-channel metal-oxide-semiconductor (PMOS) transistor, while transistors 602, 603, 609, 610, 613, 617, 623, 627, 630, 631, 634, 642, 646, 662, 670, 678, and 696 can be n-channel metal-oxide-semiconductor (NMOS) transistors. The sense amplifier latch 686 includes inverters 683 and 684 and transistors 687 and 688 (e.g., NMOS transistors). The bit line 204 is connected to one side of the source-drain path of transistor 602 and one side of the source-drain path of transistor 631. The gate of transistor 631 is connected to a SRC_GATE control signal path 633. The other side of the source-drain path of transistor 631 is connected to the common source 216. The gate of transistor 602 is connected to a DW_GATE control signal path 604.

In some embodiments, the other side of the source-drain path of transistor 602 is connected to one side of the source-drain path of transistor 610 through a DW signal path 606. The gate of transistor 610 (e.g., bit line clamp transistor) is connected to a BLCLAMP control signal path 612. The other side of the source-drain path of transistor 610 is connected to one side of the source-drain path of transistor 630 (e.g., second bit line clamp transistor), one side of the source-drain path of transistor 634, and one side of the source-drain path of transistor 646 through a signal path 614. The gate of transistor 630 is connected to a BLCLAMP2 control signal path 632. The other side of the source-drain path of transistor 630 is connected to one side of the source-drain path of transistor 622 (e.g., upper bias transistor) through a signal path 626. The gate of transistor 622 is connected to one side of the source-drain path of transistor 617 and the gate of transistor 642 (e.g., lower bias transistor) through a BL_SA_OUT signal path 690. The gate of transistor 617 is connected to a SAB_BL_PRE control signal path 619. The other side of the source-drain path of transistor 617 is connected to the input of inverter 683, the output of inverter 684, and one side of the source-drain path of transistor 687 through a SA_OUT signal path 621. The other side of the source-drain path of transistor 622 is connected to a supply node (e.g., VREG2) 618. The gate of transistor 634 is connected to an EN_DATA control signal path 636. The other side of the source-drain path of transistor 634 is connected to one side of the source-drain path of transistor 642 through a signal path 638. The other side of the source-drain path of transistor 642 is connected to a supply node (e.g., VREG0) 639.

The gate of transistor 646 is connected to a TC_ISO control signal path 648. The other side of the source-drain path of transistor 646 is connected to one side of sense capacitor 654, one side of the source-drain path of transistor 662, and the gate of transistor 678 through a TC signal path 650. This first side of the sense capacitor 654 is also connected to a sense node (TC) of the TC signal path 650. In some embodiments, the signal path 614 and the TC signal path 650 are selectively coupled to each other and can, in combination, be referred to as a sense line. Thus, this sense line can include the sense node (TC). The other (or second) side of sense capacitor 654 is connected to a sense capacitor bias node (e.g., BOOST node) 658. The gate of transistor 662 is connected to a BLC1 control signal path 664. The other side of the source-drain path of transistor 662 is connected to one side of the source-drain path of transistor 670, the other side of the source-drain path of transistor 687, one side of the source-drain path of transistor 688, one side of the source-drain path of transistor 603, one side of the source-drain path of transistor 609, one side of the source-drain path of transistor 696, and the gate of transistor 623 through a TDC_INT signal path 666. The gate of transistor 670 is connected to a SEN control signal path 672. The other side of the source-drain path of transistor 670 is connected to one side of the source-drain path of transistor 678 through a signal path 674. The other side of the source-drain path of transistor 678 is connected to a source bias node 682 (e.g., SR_GND). The transistor 678 can be referred to as a sense transistor having a gate that is connected to the sense node (TC).

The gate of transistor 687 of sense amplifier latch 686 is connected to a DRST_SA control signal path 675. The gate of transistor 688 is connected to a DST_SA signal path 676. The other side of the source-drain path of transistor 688 is connected to the output of inverter 683 and to the input of inverter 684 through a signal path 677. A control input of inverter 683 is connected to a SEN_SAB control signal path 685. A control input of inverter 684 is connected to a LAT_SAB control signal path 689.

The gate of transistor 603 is connected to a TDCINT_DIS control signal path 605. The other side of the source-drain path of transistor 603 is connected to a common or ground (e.g., GND) node 607. The gate of transistor 609 is connected to the other side of the source-drain path of transistor 696, one side of the source-drain path of transistor 623, the first latch 691, and the second latch 692 through a DATA_TRANSFER signal path 693. The other side of the source-drain path of transistor 609 is connected to one side of the source-train path of transistor 613 through a signal path 611. The gate of transistor 613 is connected to an EN_SA control signal path 615. The other side of the source-drain path of transistor 613 is connected to the common or ground node 607. The gate of transistor 696 is connected to a BLC2 control signal path 697. The other side of the source-drain path of transistor 623 is connected to one side of the source-drain path of transistor 627 through a signal path 625. The gate of transistor 627 is connected to an EN_LATCH control signal path 629. The other side of the source-drain path of transistor 627 is connected to the common or ground node 607.

In some embodiments, the page buffer 600 includes a data elaborator 601, which in turn includes a combination of the transistors 609, 613, 623, 627, and 696. The data elaborator 601 can be controlled to manipulate data that is either passed to or read from the first latch 691, the second latch 692, and/or the dynamic latch 680. In some embodiments, the data elaborator 601 includes a parasitic capacitance at a portion of the metal line of DATA_TRANSFER signal path 693 between the data elaborator 601 and the first latch 691. This parasitic capacitance together with the data elaborator 601 can also function as a dynamic latch in which data values can be accumulated during transition between programming memory cells to higher Vt levels, which be discussed in more detail with reference to FIGS. 10A-10B.

Control logic (e.g., of the local media controller 135 of FIGS. 1A-1B) can be connected to the SRC_GATE control signal path 633, the DW_GATE control signal path 604, the BLCLAMP control signal path 612, the BLCLAMP2 control signal path 632, the EN_DATA control signal path 636, the TC_ISO control signal path 648, the BLC1 control signal path 664, the SEN control signal path 672, the SAB_BL_PRE control signal path 619, the LAT_SAB control signal path 689, the SEN_SAB control signal path 685, the DRST_SA control signal path 675, the DST_SA control signal path 676, the TDCINT_DIS control signal path 605, the EN_SA control signal path 615, the BCL2 control signal path 697, and the EN_LATCH control signal path 629 to control the operation of the page buffer 600. The control logic can activate transistor 631 to selectively connect the bit line 204 to the common source 216. The control logic can activate transistor 602 to selectively connect the bit line 204 to the DW signal path 606. The control logic can activate transistor 610 to selectively connect the DW signal path 606 to the signal path 614. The control logic can activate transistor 630 to selectively connect the signal path 614 to the signal path 626. The control logic can activate transistor 634 to selectively connect the signal path 614 to the signal path 638.

The control logic can activate transistor 617 to selectively connect the SA_OUT signal path 621 to the BL_SA_OUT signal path 690. The control logic can activate transistor 646 to selectively connect the signal path 614 to the TC signal path 650. The control logic can activate transistor 662 to selectively connect the TC signal path 650 to the TDC_INT signal path 666. The control logic can activate transistor 670 to selectively connect the TDC_INT signal path 666 to the signal path 674. The control logic can activate transistor 687 of sense amplifier latch 686 to selectively connect the TDC_INT signal path 666 to the SA_OUT signal path 621. The control logic can activate transistor 688 to selectively connect the TDC_INT signal path 666 to the signal path 677. The control logic can control inverter 683 to latch a sensed state of the selected memory cell in the sense amplifier latch 686. The control logic can control inverter 684 to output the latched state from the sense amplifier latch 686. The control logic can activate transistor 603 to selectively connect the TDC_INT signal path 666 to the common or ground node 607. The control logic can activate transistor 696 to selectively connect the TDC_INT signal path 666 to the DATA_TRANSFER signal path 693. The control logic can activate transistor 613 to selectively connect the signal path 611 to the common or ground node 607. The control logic can activate transistor 627 to selectively connect the signal path 625 to the common or ground node 607.

In at least some embodiments, the page buffer 600 further includes a dynamic latch 680, which on one side is connected to the SA latch 686 and selectively connected to the sense node (TC), e.g., via the transistor 662, and on another side is connected to the source bias node (e.g., SRC_GND). The dynamic latch 680 is discussed in more detail with reference to FIG. 6B. As will be discussed in more detail, analog voltage values applied to or modified at the sense node can be digitized and stored in the SA latch 686. Further, data bit values stored in the SA latch 686 can be applied to the sense node and manipulated by a bias voltage stored in the dynamic latch 680, generating an updated voltage value at the sense node. This updated voltage can cause the data bit value of the SA latch 686 to be selectively flipped. This interchange between the SA latch 686 and the dynamic latch 680 can enable updating the TC sense node to program memory cells at one of the slow SSPC voltage ($PPV_1$) or the fast SSPC voltage ($PPV_2$) depending on the bias voltage stored in the dynamic latch 680. In this way, a combination of the dynamic latch 680 and the SA latch 686 facilitates application of multiple bias voltages for SSPC programming. In some embodiments, the bias voltage stored in the dynamic latch 680 can also be used to perform a program verify (PV) pass, e.g., by inhibiting programming during the next program pulse.

In some embodiments, the control logic of the local media controller 135 performs operations in order to transfer a program verify pass voltage (e.g., inhibit bias voltage) to the data elaborator 601. This may be performed in order to inhibit further programming due to the selected memory cells having already reached a target Vt voltage. The operations can include, for example, causing the sense node (TC) to be coupled to ground (GND), and, in response to detecting a high bit value stored in the SA latch 686, causing the program verify pass voltage (PV pass) to be transferred to the data elaborator 601.

FIG. 6B is a detailed schematic of the dynamic latch 680 of the schematic of FIG. 6A according to at least one embodiment. In at least one embodiment, the dynamic latch 680 includes an enable transistor 620 connected in series with a latch transistor 608, e.g., the source-drain path of each is connected. The latch transistor 608 includes a source coupled to the source bias node 682 and the enable transistor 620 includes a drain selectively connected to the sense node (TC), e.g., through the transistor 662. Thus, the enable transistor 620 is coupled between the latch transistor 608 and the sense line, e.g., the TC signal path 650. The dynamic latch 680 can further include one or more set transistors 628 coupled between the drain of the enable transistor 620 and a gate of the latch transistor 608. For example, the source-drain paths of the one or more set transistors 628 are coupled between the drain of the enable transistor 620 and a gate of the latch transistor 608. The drain of the enable transistor 620 and of the one or more set transistors 628 can also be coupled to the SA latch 686, e.g., via the TCD_INT signal path 666. In various embodiments, the transistors of the dynamic latch 680 can be NMOS, PMOS, or a combination of NMOS and PMOS transistors. In some embodiments, the page buffer 600 further includes a transistor 637 coupled to the TDC_INT signal path 666 between the dynamic latch 680 and the data elaborator 601 for purposes discussed with reference to FIGS. 10A-10C. The transistor 637 can be turned on by the prech_N signal.

In some embodiments, a capacitor 640 can optionally be coupled between the gate of the latch transistor 608, but can also be understood as representative of a gate capacitance of the latch transistor 608. Thus, one of the gate capacitance of the latch transistor 608 or the capacitor 640 can store a bias voltage, which is passed to the latch transistor by the one or more set transistors 628. In these embodiments, the gate of the latch transistor 608 is connected to a D_LATCH signal path 616, a gate of the enable transistor 620 is connected to an EN_SSPC2 signal path 624, and gates of the one or more set transistors 628 are connected to a DL_SET signal path 635.

In at least some embodiments, control logic of the local media controller 135 can be coupled to a D_LATCH signal path 616, to the EN_SSPC2 signal path 624, and to the DL_SET signal path 635. This control logic can perform operations that include causing a pre-program verify voltage (PPV) to provide a boost to the sense node (TC), e.g., via the BOOST node 658. In response to detecting a high bit value stored in the SA latch 686, the operations can further include causing a set voltage to turn on the one or more set transistors 628 so that one of a first bias voltage or a second bias voltage is stored at the latch transistor 608 and/or at the capacitor 640.

For example, the first bias voltage can be useable for slow programming of a selected memory cell of the string of series-connected memory cells. Further, the second bias voltage can be useable for fast programming of the selected memory cell of the string of series-connected memory cells, where the fast programming is faster than the slow programming. In some embodiments, the first bias voltage is higher than the second bias voltage. In some embodiments, the pre-program verify voltage includes one of a first pre-program verify voltage applied (e.g., $PPV_1$) when storing the first bias voltage at the latch transistor or a second pre-program verify voltage (e.g., $PPV_2$) applied when storing the second bias voltage at the latch transistor, the first pre-program verify voltage being lower than the second pre-program verify voltage. In some embodiments, the first pre-program verify voltage is approximately half the second pre-program verify voltage. Program operations to program the selected memory cell 208 to a target level are described in more detail below with reference to FIGS. 7A-9.

Figure 7A:
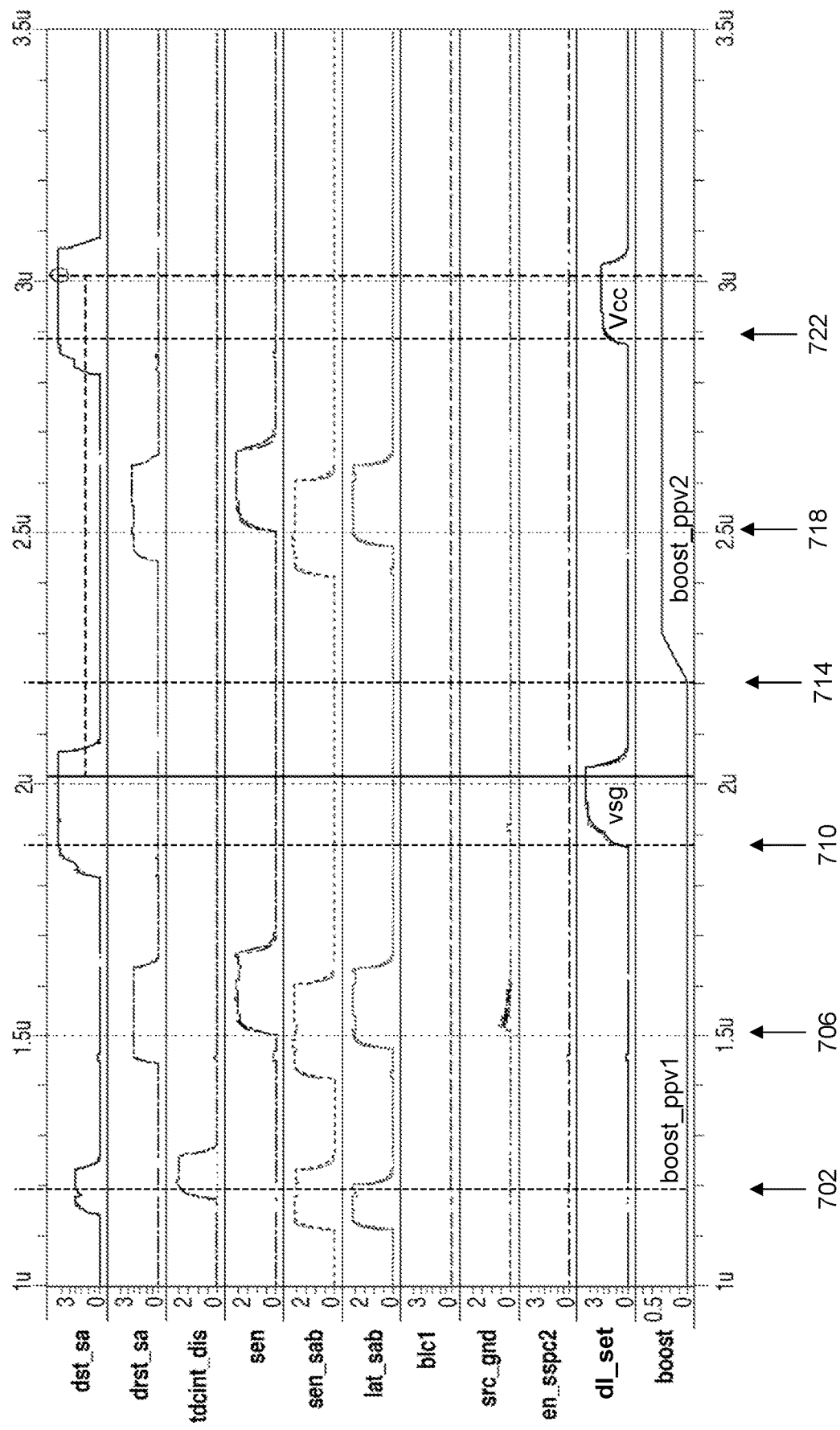
FIGS. 7A-7C are a set of graphs illustrating control and voltage level waveforms associated with the schematics of FIGS. 6A-6B for storing voltage biases in the dynamic latch according to some embodiments.
Figure 7B:
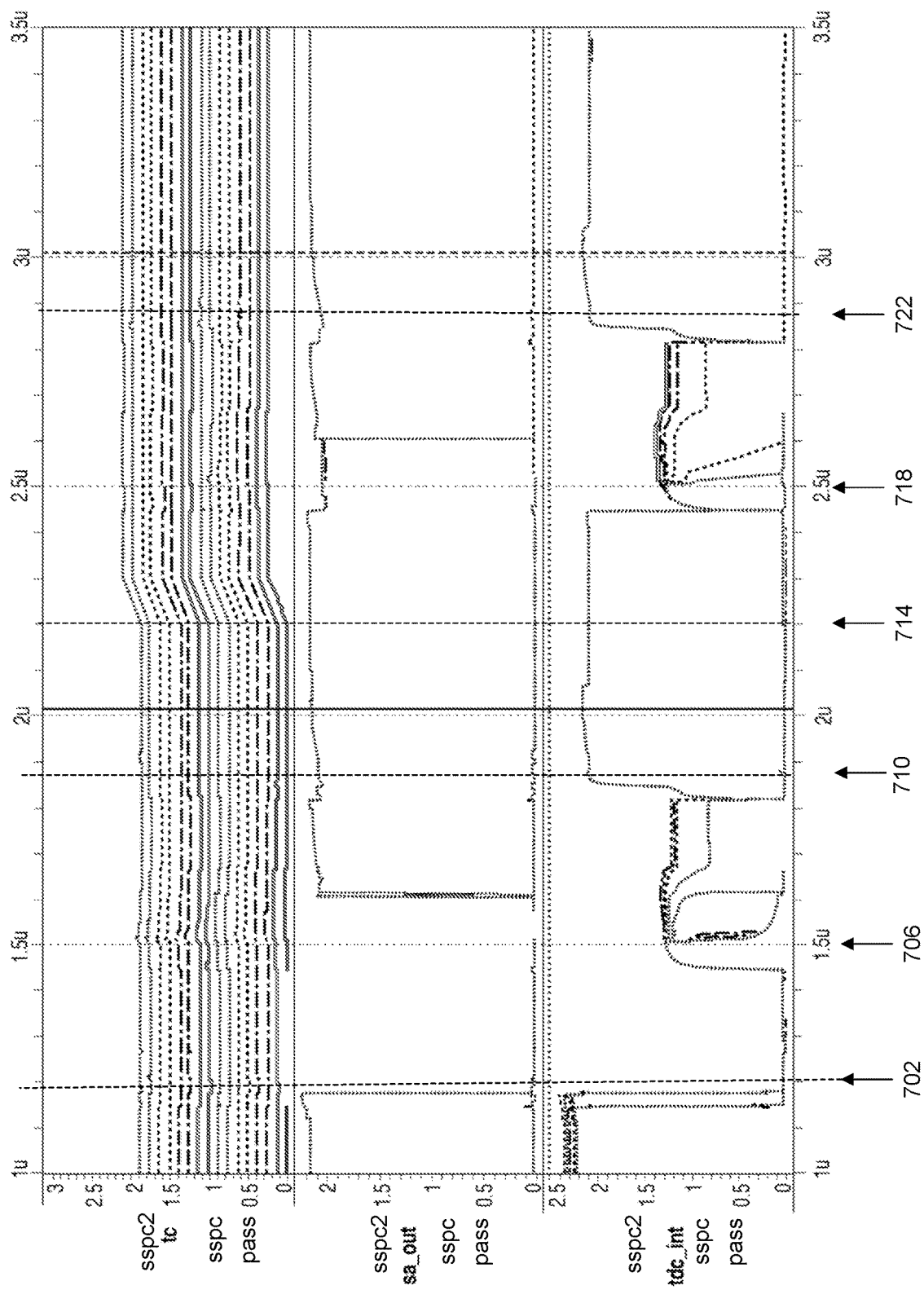
Figure 7C:
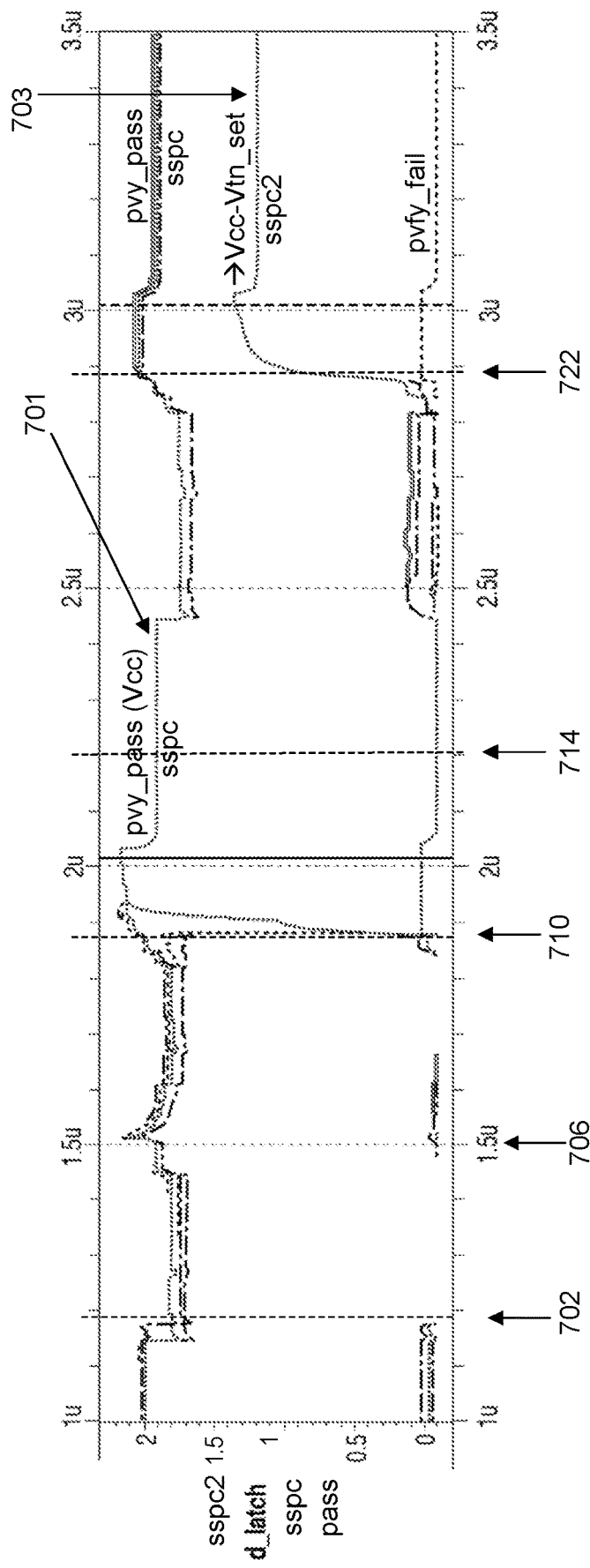

FIGS. 7A-7C are a set of graphs illustrating control and voltage level waveforms (or signals) associated with the schematics of FIGS. 6A-6B for storing voltage biases in the dynamic latch according to some embodiments. The control and voltage level waveforms, labeled at the left of each graph, correspond to control labels of the schematic of FIGS. 6A-6B (e.g., top to bottom DST_SA, DRST_SA, TDCINT_DIS, SEN, SEN_SAB, LAT_SAB, BLC1, SRC_GND, EN_SSPC, DL_SET, BOOST, TC, SA_OUT, TDC_INT, and D_LATCH), and are illustrated from left to right generally chronologically. The values illustrated for the control and voltage level waveforms are illustrative only of relative example values that can cause the page buffer 600 to function, but these values can be adjusted uniformly within some ranges and still perform as discussed. Further, some of the control and voltage level waveforms include labels of "pass," "sspc," and "sspc2," as general voltage ranges for achieving a difference bias voltage level, but are not to be understood as being absolute or exact.

At the beginning of this storing operation, the control and voltage level waveforms correspond to preparing for performing a program verify of a Vt level L1 programming in selected memory cells. Therefore, the operations illustrated and explained with reference to FIGS. 7A-7C enables a value in the SA latch 686 to trigger storing a certain value in the dynamic latch 680, e.g., corresponding to one of the slow SSPC voltage ($PPV_1$) or the fast SSPC voltage ($PPV_2$).

At time point 702, the SA latch 686 is reset by asserting the DST_SA, TDCINT_DIS, SEN_SAB, and LAT_SAB control signals, as illustrated in FIG. 7A. As a result, it can be observed that the SA_OUT and TDC_INT voltage signals drop to ground (GND) while the D_LATCH voltage drops slightly in voltage.

At time point 706, the control logic can cause a value from the SA latch 686 to be strobed so as to activate the tdc_int signal, as illustrated in FIG. 7B. The value of the SA latch 686 can be strobed by asserting the DRST_SA, TDCINT_DIS, SEN_SAB, and LAT_SAB control signals. The operation at time point 706 can provide an initial voltage to TDC_INT signal path 666. Concurrently, the control logic can cause a first pre-program verify voltage (e.g., $PPV_1$) to be applied as a boost in voltage to the sense node (TC), and thus also be applied at the gate of the sense transistor 678. Although illustrated as ground (or 0V), other low voltage boost such as in a range of 0-0.5V can also be used in various embodiments, which causes all sense levels of the page buffer 600 to be increased by the boosted voltage.

At time point 710, the control logic cause the dynamic latch 680 to be updated in order to store the first bias voltage, e.g., useable for the slow programming of the selected memory cells that employs a slow SSPC voltage (SSPC). For example, the control logic can assert the DL_SET signal, e.g., to a set voltage of Vsg (FIG. 7A), which causes the voltage at the latch transistor 608 (and D_LATCH signal path 616) to hit the first bias voltage programmed at a level of the common collector voltage (Vcc), as illustrated with reference to curve 701 in FIG. 7C. The Vsg voltage can, for example, be understood to greater than Vcc plus the threshold voltage (Vtn_set) of the one or more set transistors 628. Thus, after the drop in Vtn_set voltage, the voltage is still Vcc that is stored at the latch transistor 608.

At time point 714, the control logic causes a boost voltage to be applied to the sense node (TC) (FIG. 7A). In one embodiment, the boost voltage is a second pre-program verify voltage (e.g., $PPV_2$). This second pre-program verify voltage can, as illustrated, be about 0.5V, but other voltage ranges can also be used, such as between 0.5-1.0V, where the first pre-program verify voltage is lower than the second program pre-verify voltage. This additional boost voltage can cause all sense levels of the page buffer 600 to be increased by the now higher boosted voltage. It can also be observed that the sa_out voltage signal is at a high bit value throughout and between time points 710 and 714. Further, the BLC1 signal is also deasserted throughout so that the storing of value(s) into the dynamic latch 680 can be performed without losing charge down the sense line, which includes the TC signal path 650.

At time point 718, the control logic can again cause the SA latch 686 to be strobed so as to adjust the TDC_INT voltage signal, as illustrated in FIG. 7B. The value of the SA latch 686 can be strobed by asserting the DRST_SA, TDCINT_DIS, SEN_SAB, and LAT_SAB control signals, as done before. The strobing this time, however, causes a lower voltage at the TCD_INT node due to the higher boosted voltage at the boost node 658.

At time point 722, the control logic causes the dynamic latch 680 to be updated in order to store the second bias voltage, e.g., useable for the fast programming of the selected memory cells that employs a fast SSPC voltage (SSPC2). For example, the control logic can assert the DL_SET control signal, e.g., to a set voltage of about Vcc (FIG. 7A), which causes the voltage at the latch transistor 608 (and D_LATCH signal path 616) to hit the second bias voltage programmed at a level of the common collector voltage (Vcc) less the threshold voltage (Vtn_set) of the one or more set transistors 628, as illustrated with reference to curve 705 in FIG. 7C.

In various embodiments, the operation of storing a bias voltage in the dynamic latch 680 can be understood to be performed to store either the first bias voltage, the second bias voltage, or a zero voltage in the dynamic latch so that a given page buffer (e.g., the page buffer 600) is configured for either a slow program/verify operation (using a SSPC value), a fast program/verify operation (using an SSPC2 value), or a program/verify fail (using a zero voltage or ground value). Once one of these bias voltages is stored in the dynamic latch 680, the page buffer can proceed with operations that can apply the respective bias voltage to the sense node (TC) in order to supply one of the bit line biases discussed herein, e.g., to a signal driver.

In some embodiments, in order to apply the first bias voltage to the sense node, the control logic of the local media controller 135 can perform operations including applying a trigger voltage to the SA latch 686 (e.g., at SEN_SAB control signal path 685) and to the source bias node 682 (SRC_GND). These operations can further include turning on the enable transistor 620 of the dynamic lath 680 so the first bias voltage, stored at the latch transistor 608, is applied to the sense node (TC), e.g., via the transistor 662 upon assertion of BLC1 control signal path 664. In one embodiment, the trigger voltage is a low voltage such as between 0.3-0.6V.

In at least one alternative embodiment, after applying the trigger voltage to the source bias node 682, the operations can instead further include applying a local voltage source supply (VSSL) voltage to the SA latch 686 (which is different than the trigger voltage applied to the source bias node 682). The operations can further include turning on the enable transistor 620 so the first bias voltage, stored at the latch transistor 608, is applied to the sense node (TC).

In some embodiments, in order to apply the second bias voltage to the sense node, the control logic of the local media controller 135 can perform operations including applying a ground voltage to the SA latch 686 (e.g., at SEN_SAB control signal path 685) and to the source bias node 682 (or SRC_GND). These operations can further include turning on the enable transistor 620 of the dynamic lath 680 so the second bias voltage, stored at the latch transistor 608, is applied to the sense node (TC), e.g., via the transistor 662 upon assertion of BLC1 control signal path 664. In one embodiment, the ground voltage is a very low voltage such as 0-0.2V.

In at least one alternative embodiment, after applying the ground voltage to the source bias node 682, the operations can instead further include applying a local voltage source supply (VSSL) voltage to the SA latch 686 (which is different than the ground voltage applied to the source bias node 682). The operations can further include turning on the enable transistor 620 so the second bias voltage, stored at the latch transistor 608, is applied to the sense node (TC).

Figure 8:
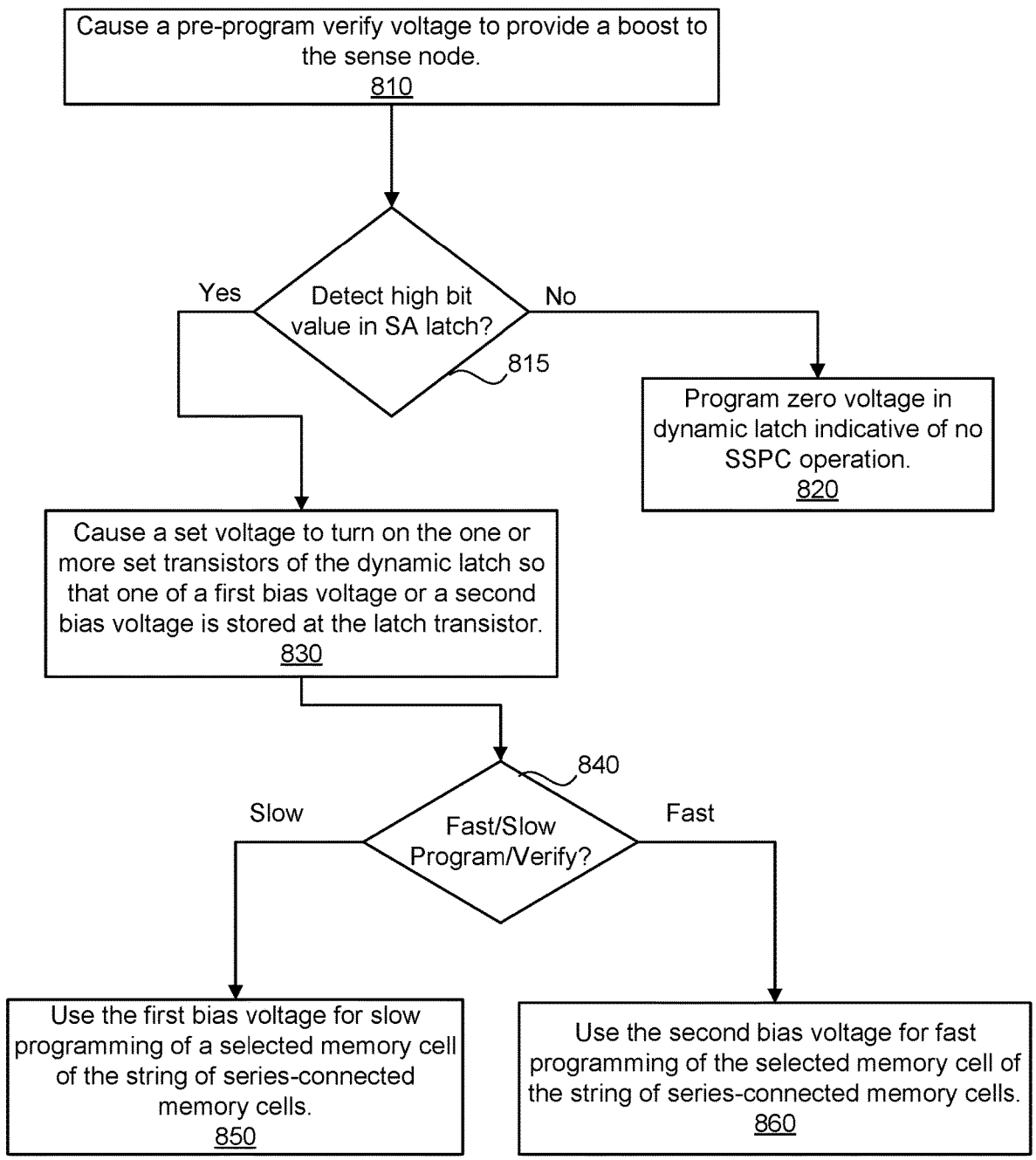
FIG. 8 is a flow diagram of an example method of selectively storing, in a dynamic latch of a page buffer, one of a first bias voltage or a second bias voltage corresponding to, respectively, a slow selective slow program convergence voltage or a fast selective slow program convergence voltage according to some embodiments.

FIG. 8 is a flow diagram of an example method 800 of selectively storing, in a dynamic latch of a page buffer, one of a first bias voltage or a second bias voltage corresponding to, respectively, a slow selective slow program convergence voltage or a fast selective slow program convergence voltage according to some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 of FIGS. 1A-1B that includes instructions registers 128.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a sense node is boosted. More specifically, the processing logic causes a pre-program verify voltage (e.g., PPV1 or PPV2) to provide a boost to the sense node (TC) to increase sense levels of the page buffer. In some embodiments, the processing logic first checks the voltage level at the sense node (TC), and assign a sense boost voltage level (such as PPV1, PPV2, or another sense level) based on the current voltage level at the sense node (TC).

At operation 815, the SA latch 686 is accessed. More specifically, the processing logic determines whether the SA latch 686 stores a high bit value or a low bit data value. In response to detecting the SA latch 686 storing a low bit value, the processing logic, at operation 820, programs an approximately zero voltage level in the dynamic latch 680 indicating that no SSPC-related operation is to be performed.

At operation 830, a selective slow program convergence voltage (SSPC) voltage level is stored. More specifically, the processing logic, in response to the SA latch 686 storing a high bit value, causes a set voltage to turn on the one or more set transistors 628 so that one of a first bias voltage or a second bias voltage is stored at the latch transistor 608. Depending on the values of the PPV boost voltage and the set voltage, the SSPC voltage level can differ based on whether a slow or a fast programming is chosen for a subsequent program/verify operation.

At operation 840, a fast or a slow SSPC voltage is determined. More specifically, the processing logic determines whether the page buffer was configured to perform program and verify operations at a slow SSPC voltage (e.g., $PPV_1$) or a fast SSPC voltage (e.g., $PPV_2$). If for a slow program/verify operation, then at operation 850, the processing logic uses the first bias voltage for slow programming of a selected memory cell of the string of series-connected memory cells. If for a fast program/verify, the processing logic uses the second bias voltage for fast programming of the selected memory cell of the string of series-connected memory cells, wherein the fast programming is faster than the slow programming.

Figure 9A:
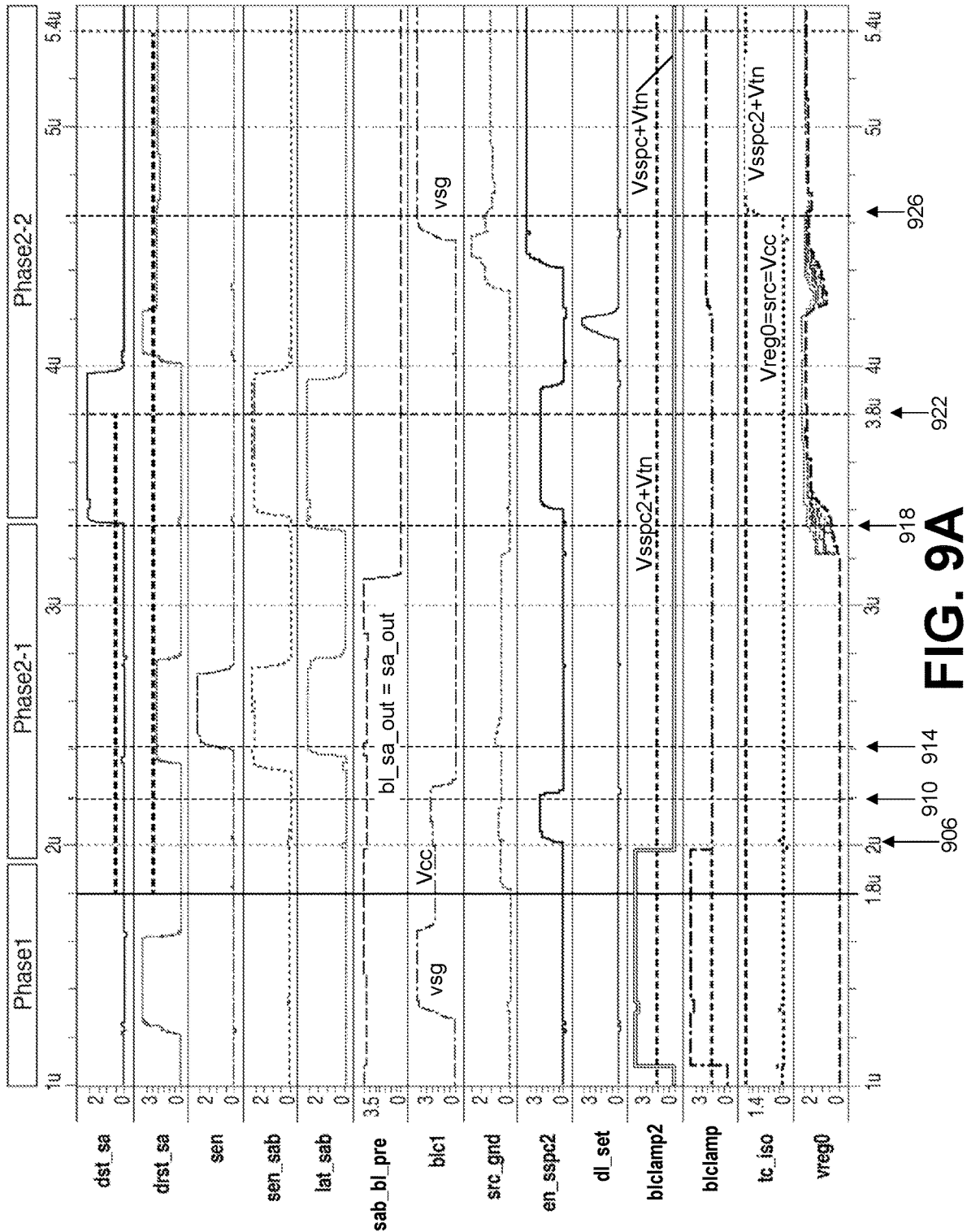
FIGS. 9A-9C are a set of graphs illustrating control and voltage level waveforms associated with the schematics of FIGS. 6A-6B for programming a bit line bias into the page buffer according to some embodiments.
Figure 9B:
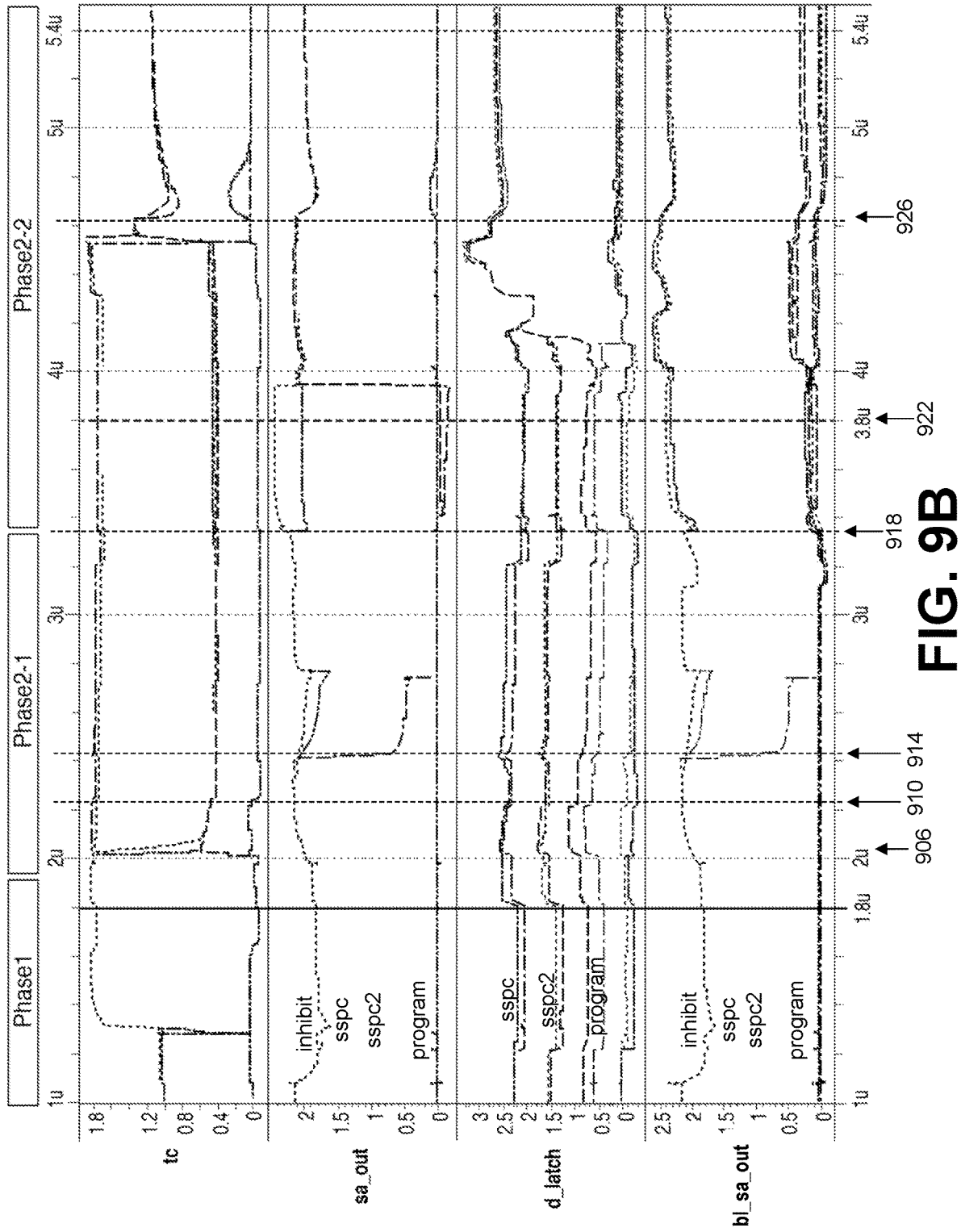
Figure 9C:
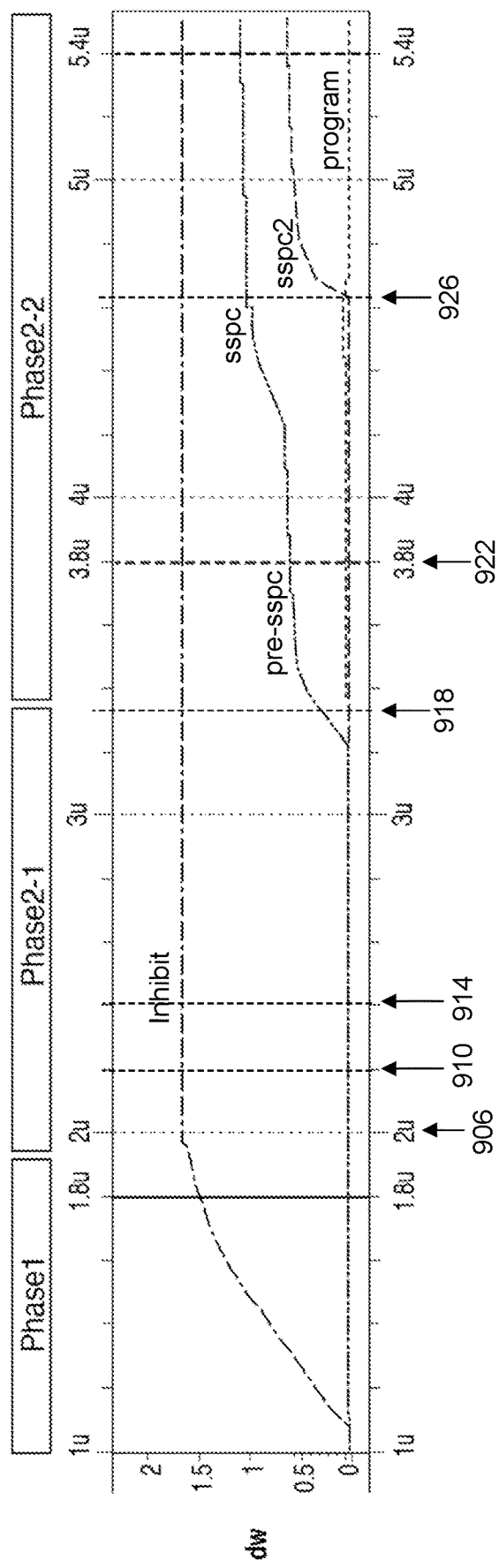

FIGS. 9A-9C are a set of graphs illustrating control and voltage level waveforms associated with the schematics of FIGS. 6A-6B for programming a bit line bias into the page buffer 600 according to some embodiments. The control and voltage level waveforms, labeled at the left of each graph, correspond to control labels of the schematic of FIGS. 6A-6B (e.g., top to bottom DST_SA, DRST_SA, SEN, SEN_SAB, LAT_SAB, SAB_BL_PRE, BLC1, SRC_GND, EN_SSPC2, DL_SET, BLCLAMP2, BLCLAMP, TC_ISO, VREG0, TC, SA_OUT, D_LATCH, BL_SA_OUT, DW), and are illustrated from left to right generally chronologically and according to phase (along the top). The values illustrated for the control and voltage level waveforms are illustrative only of relative example values that can cause the page buffer 600 to function, but these values can be adjusted uniformly within some ranges and still perform as discussed.

During Phase1, the control logic causes a program pulse to be sent down the bit line to program a selected memory cell of the string of series-connected memory cells, as illustrated at the DW signal of FIG. 9C labeled program. This DW signal can be sent over the DW signal path 606 (FIG. 6A). Further, the control logic causes programming to be increasingly inhibited during Phase1, as illustrated in the curve "Inhibit" in FIG. 9C. To perform this program/inhibit operation, the control logic can also assert the DRST_SA control signal and raise the BLC1 control signal to a Vsg voltage, followed by dropping the BLC1 control signal to a Vcc voltage. The Vsg voltage can, for example, be understood to be greater than Vcc plus the threshold voltage (Vtn_tciso) of the sense node isolation transition, e.g., transistor 646. The control logic can further assert the BLCLAMP2 and BLCLAMP control signals, to allow the Vcc on VREG2 signal path to selected memory cells of the bit line 204 for inhibit. Otherwise, for Vt levels for SSPC, SSPC2, or programming, the SAB_BL_PRE control signal is asserted so that a ground voltage at the VREG0 supply node is coupled to the selected memory cells of the bit line 204.

Additionally, as can be noted in the D_LATCH voltage signal in FIG. 9B, a value is stored in the dynamic latch 680 that corresponds to one of a program bias voltage, an SSPC2 bias voltage, or an SSPC bias voltage, which was stored there during the operations discussed with reference to FIGS. 7A-7B. One of these bias voltages, if stored, will be used during programming the page buffer 600 with a particular bias voltage for purposes of program/verify, as discussed.

During Phase2-1, while the inhibit voltage is provided to the selected cells, the control logic can cause programming of the page buffer 600 with one of three bit line bias voltages (e.g., for a program bias, an SSPC2 bias voltage, or an SSPC bias voltage), all of which are illustrated in the DW signal of FIG. 9C. To do so, in some embodiments, and at time period 906, the control logic causes an output voltage of the SA latch (SA_OUT) to be sent to the sense node (TC) (both illustrated in FIG. 9B), where the output voltage of the SA latch is one of ground or a common collector voltage (Vcc). For example, in some embodiments, the SA_OUT output voltage can be Vcc to program an inhibit bias level or ground (e.g. approximately zero or other low voltage) to program any of the SSPC, SSPC2, or program bias voltages. This SA_OUT output voltage can be sent to the sense node while the BLC1 control signal is still asserted to a Vcc voltage level.

Further, during Phase2-1 at time period 910, the control logic can further cause a first voltage of the sense node (TC) to be manipulated by a second voltage of the dynamic latch 680 (D_LATCH), as illustrated in FIG. 9B, to generate an updated first voltage at the sense node (TC). For example, causing the first voltage of the sense node (TC) to be manipulated by a second voltage of the dynamic latch 680 can include applying a trigger voltage to the SA latch 686 and to the source bias node 682 (or SRC_GND). In one embodiment, the trigger voltage is a low voltage such as between 0.3-0.6V. The control logic can further turn on the enable transistor 620 (e.g., using the EN_SSPC2 control signal) of the dynamic latch 680 to send a voltage, stored in the latch transistor 608, to the sense node (TC).

Further, during Phase2-1 at a time period 914, the control logic can further cause a bit value stored in the SA latch 686 to be selectively flipped depending on a value of the updated first voltage of the sense node (TC), as illustrated in FIG. 9B. For example, if the sense node (TC) voltage is higher than the threshold voltage (Vtn) of the transistor 678, the bit value of the SA latch 686 flips. During this time period, the control logic can also assert the DRST_SA, SEN, SEN_SAB, and LAT_SAB control signals, as illustrated in FIG. 9A, to enable selectively flipping the bit value in the SA latch 686, if necessary.

More specifically, and with continued reference to Phase2-1 at and after time period 914, if the voltage of the sense node (TC) is selectively discharged to a low voltage (e.g., 0.2-0.5V), the bit value of the SA latch 686 can remain a high bit value. However, if the voltage at the sense node (TC) remains at a higher voltage than the Vtn voltage of the transistor 678, then the bit value in the SA latch 686 can be flipped from approximately Vcc to be a low bit value, e.g., ground. In this way, the SA latch 686 can store a bit value corresponding to the selectively discharged voltage (or the updated first voltage) and the sense node (TC).

With continued reference to FIGS. 6A-6B, according to some embodiments, the bit line clamp transistor 610 is coupled between the sense line (e.g., a combination of the signal path 614 and the TC signal path 650) and the bit line 204. The enable transistor 634 is coupled between the bit line clamp transistor 610 and a first regulator voltage (VREG0). A second bit line clamp transistor 630 is coupled between the bit line clamp transistor 610 and a second regulator voltage (VREG2).

With continued reference to FIGS. 9A-9B, at the end of Phase2-1, with reference to time period 918, the control logic can further turn off the second bit line clamp transistor 630, e.g., where the BLCLAMP2 control signal was deasserted (or forced to a low voltage) at the beginning of Phase2-1 (FIG. 9A). The control logic can further move a voltage of a gate of the bit line clamp transistor 610 to a clamp voltage, e.g., where the BLCLAMP control signal was adjusted at the beginning of Phase2-1 (FIG. 9A). In some embodiments, this clamp voltage is a difference between a slow selective slow program convergence voltage (e.g., $PPV_2$) and a fast selective slow program convergence voltage (e.g., $PPV_1$). The control logic can further turn on the enable transistor 634, e.g., assert the EN_DATA control signal (not illustrated) to send the first regulator voltage (VREG0) to the sense line as a pre-voltage level for a selective slow program convergence (SSPC) bias voltage.

With continued reference to FIGS. 6A-6B, according to some embodiments, the lower bias transistor 642 is coupled between the bit line clamp transistor 610 and the first regulator voltage (VREG0). The upper bias transistor 622 is coupled between the second bit line clamp transistor 630 and the second regulator voltage (VREG2). The bit line precharge transistor 617 is coupled between gates of the lower and upper bias transistors and the SA latch 686.

With continued reference to FIGS. 9A-9B, at around the beginning of Phase2-2, e.g., to include time period 922, the control logic can further cause the second bit line clamp transistor 630 to stay turned off and turning off the bit line precharge transistor 617, if still turned on (although the SAB_BL_PRE control signal was turned off already nearing the end of Phase2-1 in this particular example of FIG. 9A). With the bit line precharge transistor 617 turned off, the BL_SA_OUT voltage signal and the SA_OUT voltage signal can carry different data values. In this way, the BL_SA_OUT voltage signal can be understood to use a parasitic capacitance of the BL_SA_OUT control signal path 690 as another dynamic latch.

During this first portion of Phase2-2, the control logic can also cause an SSPC2-related update to the SA latch 686. For example, the control logic can apply a ground voltage to the source bias node 682 (e.g., SRC_GND), as illustrated in FIG. 9A. The control logic can further assert multiple control signals of the SA latch 686 to enable updating the output voltage (SA_OUT) of the SA latch. These multiple control signals can include, for example, the DST_SA, SEN_SAB, and LAT_SAB control signals (FIG. 9A).

The control logic can further turn on the enable transistor 620 of the dynamic latch 680, e.g., by asserting the EN_SSPC2 control signal (FIG. 9A), so that the output voltage of the SA latch 686 is selectively discharged depending on the bias voltage stored in the latch transistor (FIG. 9B). For example, if the voltage stored at the latch transistor 608 is approximately Vcc less a threshold voltage (Vtn DL)

of the transistors of the dynamic latch 680, the bit value in the SA latch 686 can be discharged to a ground potential, e.g., a low bit value. This low bit value can correspond to a fast SSPC bias voltage (e.g., SSPC2).

With continued reference to FIGS. 6A-6B, the isolation transistor 646 is connected to the sense line and coupled between the bit line clamp transistor 610 and the dynamic latch 680. With continued reference to FIGS. 9A-9C, in some embodiments, during a latter part of Phase2-2, (e.g., at approximately a time period 926), the control logic of the local media controller 135 further cause the bit line 204 to be biased with the SSPC2-level bias voltage for which the SA latch 686 was updated earlier.

To do so, in various embodiments, the control logic can keep the second bit line clamp transistor 630 turned off and keep the bit line precharge transistor 617 turned off, respectively by deasserting the BLCLAMP2 and SAB_BL_PRE control signals (FIG. 9A). Further, the control logic can apply the Vcc voltage to the source bias node 682 of the dynamic latch 680 (e.g., SRC_GND). The control logic can further trigger the SA latch 686 to release a bias voltage used for fast programming of the selected memory cell (FIG. 9B), e.g., the fast SSPC2 bias voltage. Concurrently, the control logic can turn on the transistor 662, e.g., by asserting the BLC1 control signal to a voltage of Vsg. The control logic can further cause the isolation transistor 646 to clamp the bias voltage, e.g., by asserting the TC_ISO control signal to a VSSPC2 plus a threshold voltage (Vtn_tciso) (FIG. 9A).

Further, the control logic can drive the bit line 204 with the slow SSPC bias voltage from VREG0 and the BLCLAMP control signal can be shifted up to a Vsspc clamp level, to cause the bit line clamp transistor 610 to clamp the slow SSPC bias voltage. More specifically, the control logic can cause the bit line clamp transistor 610 to increase a clamp voltage that is applied to a gate of the bit line clamp transistor 610, where the increased clamp voltage is a slow selective slow program convergence (SSPC) voltage plus a threshold voltage (Vtn_tciso) of the isolation transistor. The control logic can further cause the lower bias transistor 642 to be turned on to pass the first regulator voltage (VREG0) to the bit line clamp transistor 610. The DW voltage signal of FIG. 9C illustrates either of the SSPC or the SSPC2 bias voltage being applied at time period 926.

Figure 10A:
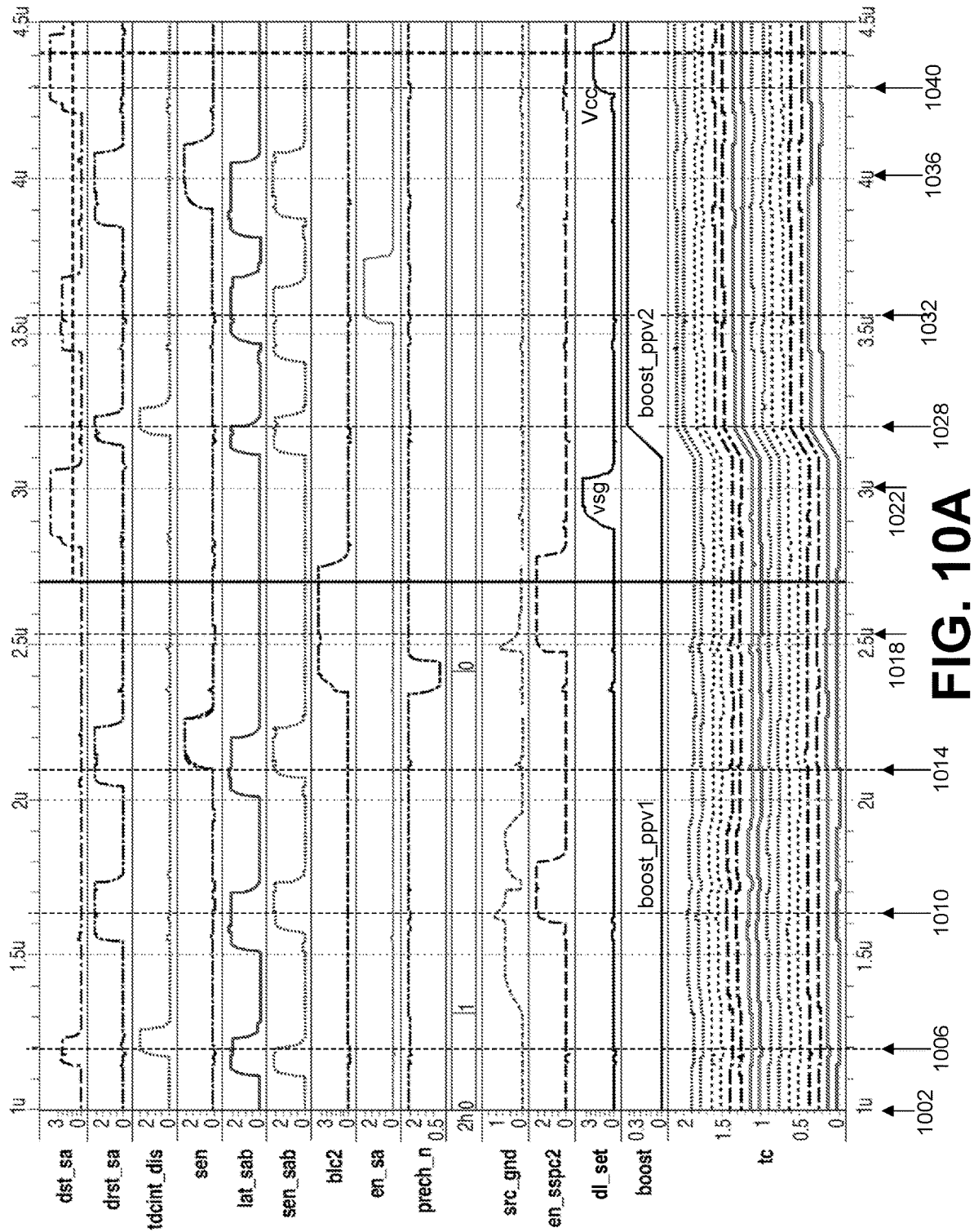
FIGS. 10A-10B are a set of graphs illustrating control and voltage level waveforms associated with the schematics of FIGS. 6A-6B for accumulating bias voltage levels between programming operations of multiple threshold voltage levels according to some embodiments.
Figure 10B:
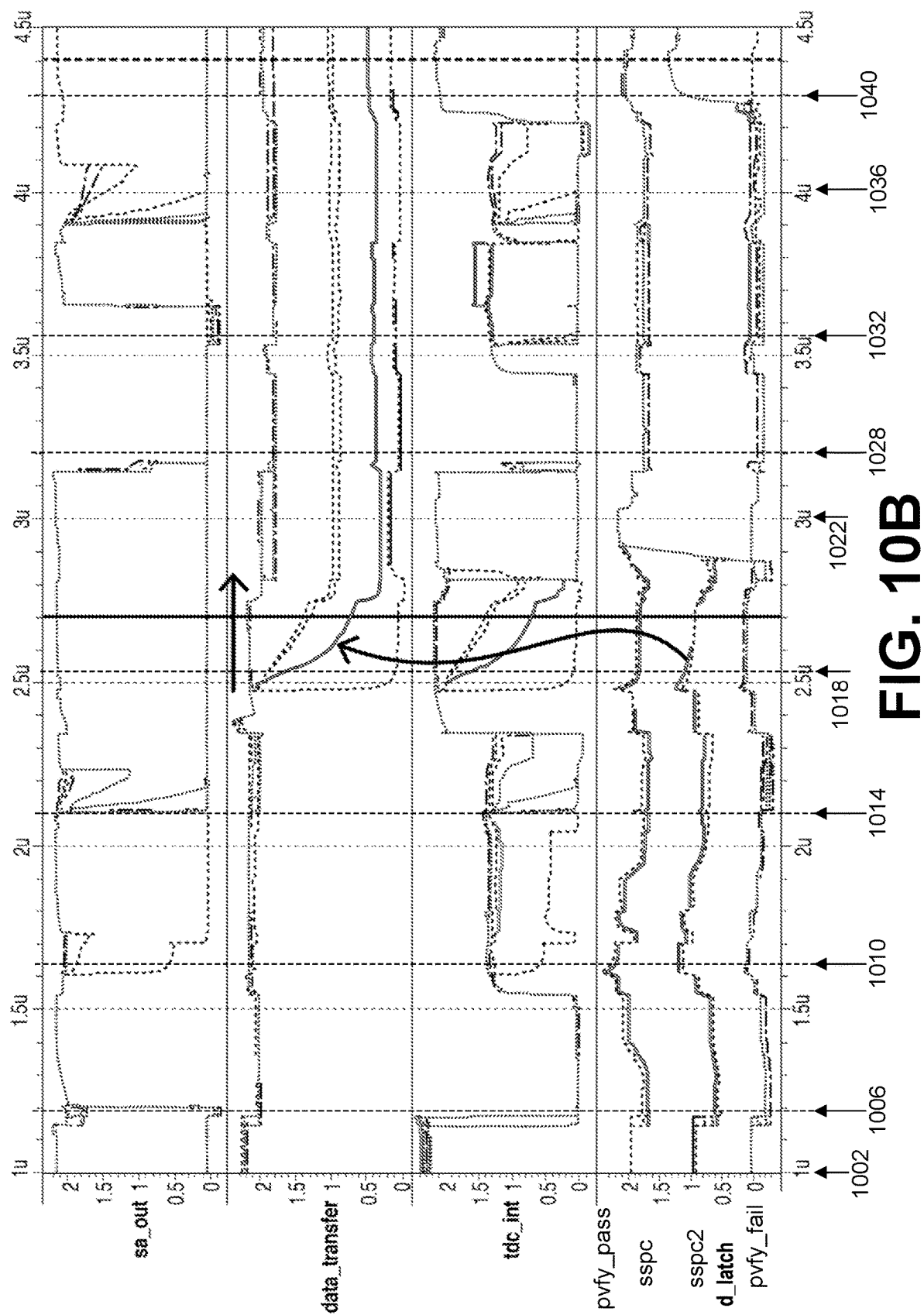

FIGS. 10A-10B are a set of graphs illustrating control and voltage level waveforms associated with the schematics of FIGS. 6A-6B for accumulating bias voltage levels between programming operations of multiple threshold voltage levels according to some embodiments. FIG. 10C is an annotated table illustrating and describing data flow through the page buffer 600 according to the graphs of FIGS. 10A-10B according some embodiments. The annotated table of FIG. 10C includes reference to several time periods (TP) in the left-most column that correspond to the same time periods marked on the graphs of FIG. 10A-10B.

In various embodiments, the accumulation directed by the control logic with reference to the page buffer 600 is of SSPC-related bias voltages to be employed in SSPC-related programming and program verifying of a second Vt level, e.g., L2, within multi-level cells (MLCs). The control logic of the local media controller 135, for example, can direct accumulating a level one (L1) Vt bias voltage (LV1) stored in the dynamic latch 680 with a level two (L2) Vt bias voltage (LV2) stored at the sense node (TC), and once combined, store the accumulated LV1 and LV2 values associated with L2 SSPC2 programming into the dynamic latch 680. Once this accumulation has been complete, the page buffer 600 is prepared for performing L2 selective slow program convergence (SSPC)-based program/verify that will follow the initial program/verify of the selected memory cell(s).

In various embodiments, at the beginning of performing an accumulation operation, illustrated as time period 1002, an initial state of the page buffer 600 is that a selected memory cell has been programmed and verified at a LV2 threshold voltage (Vt), and thus, one of the LV2 SSPC bias voltage or LV2 SSPC2 bias voltage is stored at the sense node (TC). This LV2 (SSPC or SSPC2) bias voltage will depend on a sensed Istring voltage value of a string of memory cells. Further, at the dynamic latch 680, e.g., at the D_LATCH signal 616, is stored one of the LV1 SSPC bias voltage or LV1 SSPC2 bias voltage.

Further, at time period 1006 in at least some embodiments, the control logic resets of the SA latch 686. In at least one embodiment, the SA latch 686 is reset by asserting the DST_SA, TDCINT_DIS, SEN_SAB, and LAT_SAB control signals, as illustrated in FIG. 10A. As a result, it can be observed that the SA_OUT data signal goes high and the TDC_INT voltage signal drop to ground (GND) while the D_LATCH voltage signal drops slightly in voltage (FIG. 10B).

Additionally, at time period 1010 in at least some embodiments, the control logic copies the value for LV2 SSPC to the SA latch 686, e.g., by causing the source bias node 682 (e.g., SRC_GND) to a low voltage above ground to turn off the LV1 SSPC2 value stored in the dynamic latch 680. Thus, the SA latch 686 can then store a data bit value corresponding to the LV1 SSPC bias voltage, as illustrated in FIG. 10B. As before, the EN_SSPC2 signal is asserted to turn on the enable transistor 620 and read out the bias voltage stored at the latch transistor 608.

Further, at time period 1014 in at least some embodiments, the control logic strobes the voltage stored at the sense node (TC) (FIG. 10A) to the SA latch 686 (FIG. 10B) while applying a PPV1 boost voltage (boost_ppv1) to the boost node 658, to provide boost modulation.

Additionally, at time period 1018 in at least some embodiments, the control logic causes a backup of the LV1 SSPC2 bias voltage stored in the dynamic latch 680 (FIG. 10B) to the DATA_TRANSFER signal path 693 (FIG. 10B), which acts as another dynamic latch. For example, the DATA_TRANSFER signal path 693 adjacent to the data elaborator 601 can act as parasitic capacitance to store a voltage level/data, which was discussed in more detail with reference to FIG. 6A. The control logic can turn on the transistor 637 (FIG. 6B) with the prech_N signal (FIG. 10A) to provide a voltage supply to the TDC_INT signal path 666 for purposes of storing this backup of the LV1 SSPC bias voltage to the DATA_TRANSFER signal path 693. The time period 1018 is extended somewhat to provide time for the DATA_TRANSFER signal path 693 to brought a value of the D_LATCH signal, which is discharged from a LV1 SSPC2 bias voltage.

Further, at time period 1022 in at least some embodiments, the control logic can cause the data value in the SA latch 686 to be copied to the dynamic latch 680, e.g., to be stored at in the latch transistor 608. To do so, the control logic can cause the dl_set control signal to go to a voltage of approximately Vsg. The Vsg voltage can, for example, be understood to greater than Vcc plus the threshold voltage (Vtn_set) of the one or more set transistors 628.

Additionally, at time period 1028 in at least some embodiments, the control logic again rests the SA latch 686. In at least one embodiment, the SA latch 686 is reset by asserting the DST_SA, TDONT_DIS, SEN_SAB, and LAT_SAB control signals, as illustrated in FIG. 10A. As a result, it can be observed that the SA_OUT data signal goes low and the TDC_INT voltage signal drop to ground (GND) while the D_LATCH voltage signal drops slightly in voltage (FIG. 10B). The SA latch 686 can be discharged through the transistor 603 when the TDCINT_DIS signal is asserted (FIG. 10B).

Additionally, at time period 1032 in at least some embodiments, the control logic copies a value for the LV1 SSPC2 bias voltage from the DATA_TRANSFER signal path 693 to the SA latch 686. All bias voltages may then correspond to a high bit value in the SA latch 686, e.g., the program verify value for LV1 stays at a high bit value as well. The time period 1032 is also extended somewhat to provide time for the DATA_TRANSFER signal path 693 to be discharged. Further, the EN_SA control signal of the data elaborator 601 is asserted along with the DST_SA, LAT_SAB, and SEN_SAB control signals.

Further, at time period 1036 in at least some embodiments, the control logic strobes the voltage stored at the sense node (TC) to the SA latch 686 while causing a second pre-program verify boost voltage (boost_ppv2) to be applied to the boost node 658 to provide boost modulation. Thus, the SA latch 686 now stores a bit value associated with both the LV1 SSPC2 and the LV2 SSPC2 bias voltages, completing the accumulation of the two bias voltages as a bit value stored in the SA latch 686. If the bit value is low now corresponds again to a program verify fail (or ground) voltage level. The other three bias voltages correspond to a high bit value.

Finally, at time period 1040 in at least some embodiments, the control logic causes the dynamic latch 680 to be updated to store a bias voltage corresponding to both the LV1 SSPC2 bias voltage accumulated with the LV2 SSPC2 bias voltage, as illustrated in the increased voltage in at the D_LATCH signal 616 in FIG. 10B. The DL_SET signal can be set to about a common collector voltage (Vcc) during this accumulation step while the boost node 658 can be kept at the boost_ppv2 level. The TDC_INT signal is also increased during this time.

Figure 11:
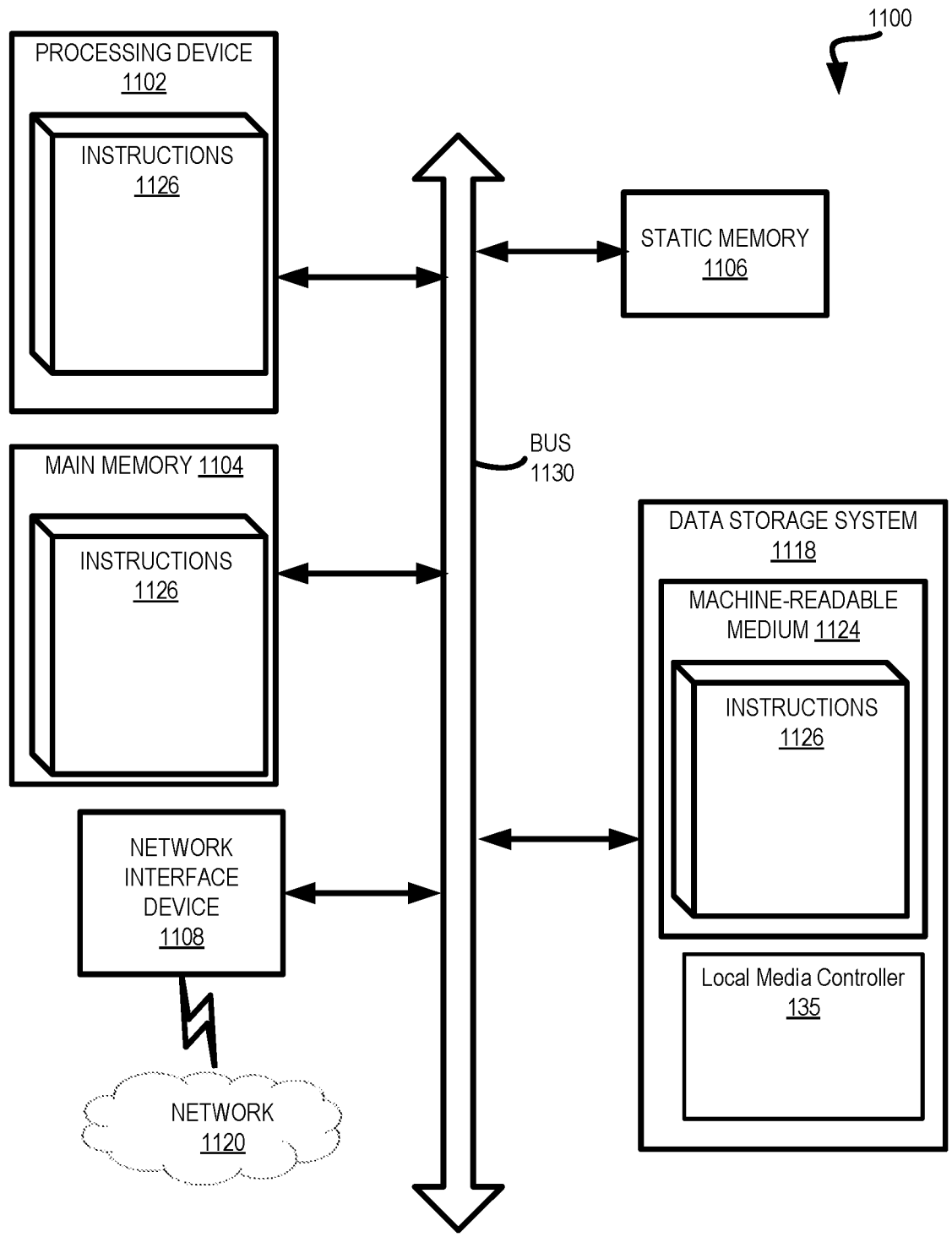
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 of FIG. 1A), also referred to as control logic herein. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1110 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1128 for performing the operations and steps discussed herein. The computer system 1100 can further include a network interface device 1112 to communicate over the network 1120.

The data storage system 1118 can include a machine-readable storage medium 1124 (also known as a computer-readable medium) on which is stored one or more sets of instructions 1128 or software embodying any one or more of the methodologies or functions described herein. The data storage system 1118 can further include the local media controller 135, which were previously discussed. The instructions 1128 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1A.

In one embodiment, the instructions 1126 include instructions to implement functionality corresponding to a controller (e.g., the memory sub-system controller 115 of FIG. 1A). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a sense amplifier (SA) latch selectively connected to a sense node;
   a dynamic latch connected to the SA latch and selectively connected to the sense node, the dynamic latch comprising:
      a latch transistor having a source coupled to a source bias node and a drain selectively connected to the sense node; and
      one or more set transistors coupled between the SA latch and a gate of the latch transistor, the one or more set transistors also selectively connected to the sense node;
   a sense line comprising the sense node and selectively connected to the SA latch, the dynamic latch, and a bit line that is coupled to a string of series-connected memory cells; and
   control logic coupled to at least the SA latch and the dynamic latch, the control logic to perform operations comprising:
      causing a pre-program verify voltage to provide a boost to the sense node; and
      in response to detecting a high bit value stored in the SA latch, causing a set voltage to turn on the one or more set transistors so that one of a first bias voltage or a second bias voltage is stored at the latch transistor, wherein:
         the first bias voltage is useable for slow programming of a selected memory cell of the string of series-connected memory cells; and
         the second bias voltage is useable for fast programming of the selected memory cell of the string of series-connected memory cells, wherein the fast programming is faster than the slow programming.

2. The memory device of claim 1, wherein the first bias voltage is higher than the second bias voltage, and wherein the pre-program verify voltage comprises one of a first pre-program verify voltage applied when storing the first bias voltage at the latch transistor or a second pre-program verify voltage applied when storing the second bias voltage at the latch transistor, the first pre-program verify voltage being lower than the second pre-program verify voltage.

3. The memory device of claim 2, wherein the first pre-program verify voltage is approximately half the second pre-program verify voltage.

4. The memory device of claim 1, wherein the first bias voltage is associated with a slow selective slow program convergence voltage and is programmed at a level of a common collector voltage (Vcc), and wherein the set voltage is greater than Vcc plus a threshold voltage of the one or more set transistors.

5. The memory device of claim 4, wherein the dynamic latch further comprises an enable transistor coupled between the latch transistor and the sense line, and wherein, to apply the first bias voltage to the sense node, the operations further comprise:
   applying a trigger voltage to the SA latch and to the source bias node; and
   turning on the enable transistor so the first bias voltage, stored at the latch transistor, is applied to the sense node.

6. The memory device of claim 4, wherein the dynamic latch further comprises an enable transistor coupled between the latch transistor and the sense line, and wherein, to apply the first bias voltage to the sense node, the operations further comprise:
applying a trigger voltage to the source bias node;
applying a local voltage source supply (VSSL) voltage to the SA latch; and
turning on the enable transistor so the first bias voltage, stored at the latch transistor, is applied to the sense node.

7. The memory device of claim 1, wherein the second bias voltage is associated with a fast selective slow program convergence voltage and is programmed at a level of a common collector voltage (Vcc) less a threshold voltage of the latch transistor, and wherein the set voltage is approximately the pre-program verify voltage plus a threshold voltage of the one or more set transistors.

8. The memory device of claim 7, wherein the dynamic latch further comprises an enable transistor coupled between the latch transistor and the sense line, and wherein, to apply the second bias voltage to the sense node, the operations further comprise:
applying a ground voltage to the SA latch and to the source bias node; and
turning on the enable transistor so the second bias voltage, stored at the latch transistor, is applied to the sense node.

9. The memory device of claim 7, wherein the dynamic latch further comprises an enable transistor coupled between the latch transistor and the sense line, and wherein, to apply the second bias voltage to the sense node, the operations further comprise:
applying a ground voltage to the source bias node;
applying a local voltage source supply (VSSL) voltage to the SA latch; and
turning on the enable transistor so the second bias voltage, stored at the latch transistor, is applied to the sense node.

10. The memory device of claim 1, further comprising a data elaborator coupled to the SA latch, wherein the operations further comprise:
causing the sense node to be coupled to ground; and
in response to detecting the high bit value stored in the SA latch, causing a program verify pass voltage to be transferred to the data elaborator.

11. A method of operating a memory device comprising a sense amplifier (SA) latch selectively connected to a sense node; a dynamic latch connected to the SA latch and selectively connected to the sense node, the dynamic latch including a latch transistor and one or more set transistors; a sense line comprising the sense node and selectively connected to the SA latch, the dynamic latch, and a bit line that is coupled to a string of series-connected memory cells, and wherein the method of operating the memory device comprises performing a plurality of operations comprising:
causing a pre-program verify voltage to provide a boost to the sense node; and
in response to detecting a high bit value stored in the SA latch, causing a set voltage to turn on the one or more set transistors of the dynamic latch so that one of a first bias voltage or a second bias voltage is stored at the latch transistor, wherein:
the first bias voltage is useable for slow programming of a selected memory cell of the string of series-connected memory cells; and
the second bias voltage is useable for fast programming of the selected memory cell of the string of series-connected memory cells, wherein the fast programming is faster than the slow programming.

12. The method of claim 11, wherein the first bias voltage is higher than the second bias voltage, and wherein the pre-program verify voltage comprises one of a first pre-program verify voltage useable for storing the first bias voltage at the latch transistor or a second pre-program verify voltage useable for storing the second bias voltage at the latch transistor, the first pre-program verify voltage being lower than the second pre-program verify voltage.

13. A memory device comprising:
a sense amplifier (SA) latch selectively connected to a sense node;
a dynamic latch connected to the SA latch and selectively connected to the sense node;
a sense line comprising the sense node and selectively connected to the SA latch, the dynamic latch, and a bit line, wherein the bit line is coupled to a string of series-connected memory cells; and
control logic coupled to the SA latch and the dynamic latch, wherein to program a bit line bias, the control logic is to perform operations comprising:
causing a program pulse to be sent down the bit line to program a selected memory cell of the string of series-connected memory cells;
causing an output voltage of the SA latch to be sent to the sense node, wherein the output voltage of the SA latch is a common collector voltage (Vcc);
causing a first voltage of the sense node to be selectively discharged by the dynamic latch to generate an updated first voltage at the sense node; and
causing a bit value stored in the SA latch to be selectively flipped depending on a value of the updated first voltage of the sense node.

14. The memory device of claim 13, wherein the dynamic latch comprises:
an enable transistor connected in series with a latch transistor, the latch transistor having a source coupled to a source bias node and the enable transistor having a drain selectively connected to the sense node; and
one or more set transistors coupled between the drain of the enable transistor and a gate of the latch transistor; and
wherein causing the first voltage of the sense node to be selectively discharged by a second voltage of the dynamic latch comprises:
applying a trigger voltage to the SA latch and to the source bias node; and
turning on the enable transistor to selectively discharge the updated first voltage at the sense node via the dynamic latch.

15. The memory device of claim 13, further comprising:
a bit line clamp transistor coupled between the sense line and the bit line;
an enable transistor coupled between the bit line clamp transistor and a first regulator voltage; and
a second bit line clamp transistor coupled between the bit line clamp transistor and a second regulator voltage; and
wherein the operations further comprise:
turning off the second bit line clamp transistor;
moving a voltage of a gate of the bit line clamp transistor to a clamp voltage; and
turning on the enable transistor to send the first regulator voltage to the sense line as a pre-voltage level for a selective slow program convergence voltage.

16. The memory device of claim 15, wherein the clamp voltage comprises a difference between a slow selective slow program convergence voltage and a fast selective slow program convergence voltage.

17. The memory device of claim 15, further comprising:
a lower bias transistor coupled between the bit line clamp transistor and the first regulator voltage;
an upper bias transistor coupled between the second bit line clamp transistor and the second regulator voltage; and
a bit line precharge transistor coupled between gates of the lower and upper bias transistors and the SA latch; and
wherein the operations further comprise:
keeping the second bit line clamp transistor turned off; and
turning off the bit line precharge transistor.

18. The memory device of claim 17, wherein the dynamic latch comprises:
an enable transistor connected in series with a latch transistor, the latch transistor having a source coupled to a source bias node and the enable transistor having a drain selectively connected to the sense node; and
one or more set transistors coupled between the drain of the enable transistor and a gate of the latch transistor; and
wherein the operations further comprise:
applying a ground voltage to the source bias node;
asserting multiple control signals of the SA latch to enable updating the output voltage of the SA latch; and
turning on the enable transistor so that the output voltage of the SA latch is selectively discharged depending on the bias voltage stored in the latch transistor.

19. The memory device of claim 17, further comprising:
an isolation transistor connected to the sense line and coupled between the bit line clamp transistor and the dynamic latch; and
wherein the operations further comprise:
keeping the second bit line clamp transistor turned off;
keeping the bit line precharge transistor turned off;
applying the Vcc to a source bias node of the dynamic latch;
triggering the SA latch to release a bias voltage used for fast programming of the selected memory cell; and
causing the isolation transistor to clamp the bias voltage.

20. The memory device of claim 19, wherein the operations further comprise:
causing the bit line clamp transistor to increase a clamp voltage that is applied to a gate of the bit line clamp transistor, wherein the increased clamp voltage comprises a slow selective slow program convergence voltage plus a threshold voltage of the isolation transistor; and
causing the lower bias transistor to be turned on to pass the first regulator voltage to the bit line clamp transistor.

* * * * *